(12) United States Patent
Vadivel et al.

(10) Patent No.: US 11,700,727 B2
(45) Date of Patent: Jul. 11, 2023

(54) MICROELECTRONIC DEVICE STRUCTURES INCLUDING TIERED STACKS COMPRISING STAGGERED BLOCK STRUCTURES SEPARATED BY SLOT STRUCTURES, AND RELATED ELECTRONIC SYSTEMS AND METHODS

(71) Applicant: Micron Technology, Inc., Boise, ID (US)

(72) Inventors: Shruthi Kumara Vadivel, Boise, ID (US); Yi Hu, Boise, ID (US); Harsh Narendrakumar Jain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 17/111,275

(22) Filed: Dec. 3, 2020

(65) Prior Publication Data
US 2022/0181342 A1 Jun. 9, 2022

(51) Int. Cl.
*H10B 41/27* (2023.01)
*G11C 5/06* (2006.01)
*G11C 5/02* (2006.01)
*H10B 43/27* (2023.01)
*H10B 43/10* (2023.01)
*H10B 43/50* (2023.01)
*H10B 41/35* (2023.01)
*H10B 41/50* (2023.01)
*H10B 43/35* (2023.01)

(52) U.S. Cl.
CPC ............ *H10B 41/27* (2023.02); *G11C 5/025* (2013.01); *G11C 5/06* (2013.01); *H10B 41/35* (2023.02); *H10B 41/50* (2023.02); *H10B 43/10* (2023.02); *H10B 43/27* (2023.02); *H10B 43/35* (2023.02); *H10B 43/50* (2023.02)

(58) Field of Classification Search
CPC ......... H01L 27/11556; H01L 27/11582; H01L 27/11519; H01L 27/11565; H01L 27/11548; H01L 27/11575
See application file for complete search history.

(56) References Cited

U.S. PATENT DOCUMENTS

| 9,064,576 B2 | 6/2015 | Tanzawa |
| 9,941,209 B2 | 4/2018 | Wolstenholme et al. |
| 10,141,330 B1 | 11/2018 | Lindsay et al. |

(Continued)

*Primary Examiner* — Sarah K Salerno
(74) *Attorney, Agent, or Firm* — TraskBritt

(57) ABSTRACT

A microelectronic device comprises a stack structure comprising a vertically alternating sequence of conductive structures and insulative structures arranged in tiers. The stack structure comprises a first block structure comprising stair step structures spaced from each other by crest regions, the stair step structures each comprising steps defined at horizontal edges of the tiers of the conductive structures and the insulative structures, and a second block structure horizontally neighboring the first block structure and comprising additional stair step structures spaced from one another by additional crest regions, the additional stair step structures horizontally offset from the stair step structures of the first block structure, and a slot structure extending though the stack structure and interposed between the first block structure and the second block structure. Related microelectronic devices, electronic systems, and methods are also described.

26 Claims, 17 Drawing Sheets

(56) References Cited

U.S. PATENT DOCUMENTS

| | | |
|---|---|---|
| 10,269,629 B2 | 4/2019 | Kim et al. |
| 10,381,080 B2 | 8/2019 | Pan et al. |
| 10,580,795 B1 | 3/2020 | Luo et al. |
| 2019/0115358 A1* | 4/2019 | Lee .................. H01L 21/76816 |
| 2021/0134827 A1* | 5/2021 | Iwai .................. H01L 21/76802 |

* cited by examiner

MICROELECTRONIC DEVICE STRUCTURES INCLUDING TIERED STACKS COMPRISING STAGGERED BLOCK STRUCTURES SEPARATED BY SLOT STRUCTURES, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures and/or the quantity of steps in individual staircase structures) of a stack structure without undesirably increasing the overall width (e.g., lateral footprint) of the stack structure can result in undesirably complex and congested routing paths to electrically connect the conductive structures to additional components (e.g., string drivers) of the memory device.

BRIEF DESCRIPTION OF THE DRAWINGS

FIG. 1A through FIG. 1M are simplified cross-sectional views (FIG. 1A, FIG. 1B, FIG. 1D through FIG. 1G, FIG. 1I, FIG. 1K, and FIG. 1L) and top-down views (FIG. 1C, FIG. 1H, FIG. 1J, and FIG. 1M) illustrating a method of forming a microelectronic device structure, in accordance with embodiments of the disclosure;

DETAILED DESCRIPTION

Figure 1A:
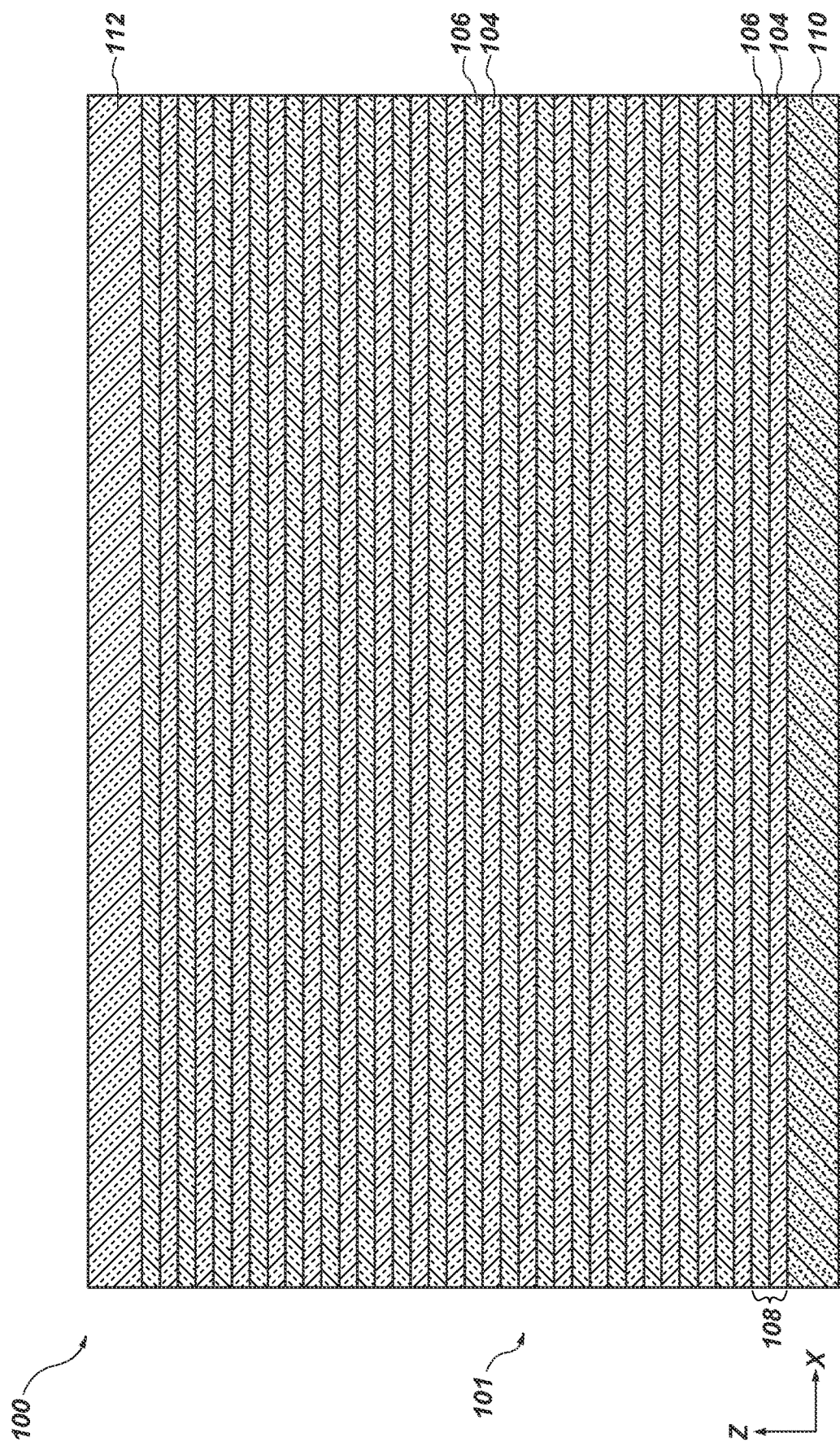

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising alternating conductive structures and insulative structures arranged in tiers, each tier comprising a conductive structure and an insulative structure. Strings of memory cells extend through the stack structure and may comprise, for example, a channel material extending through the stack structure as part of pillar structures. Support pillar structures extend through the stack structure and comprise an insulative material. The stack structure may be divided into block structures exhibiting a staggered layout and separated from one another by slot structures. The slot structures comprise an insulative material extending through the stack structure. The block structures each comprise stair step structures including steps defined at horizontal edges of the tiers of the conductive structures and insulative structures. Stair step structures of each block structure are spaced from one another by intervening crest regions not including steps. The crest regions have a horizontal dimension (e.g., width) that is less than a corresponding horizontal dimension of the stair step structures. In some embodiments, the stair step structures include a greater quantity of the support pillar structures than the crest regions. In some embodiments, the stair step structures of a block structure extend into horizontal boundaries of neighboring block structures and the stair step structures of the neighboring block structures extend into the horizontal boundaries of the block structure. Conductive contact structures extend through an insulative material and are electrically coupled to the conductive structures.

The block structures may exhibit a staggered layout, wherein the stair step structures of one block structure horizontally neighbors a crest region of a horizontally neighboring block structure. The staggered layout of the block structures facilitates a greater dimension of the stair step structures without increasing the area of the stack structure for a given density of strings of memory cells. In some embodiments, the stair step structures exhibit a greater dimension than a corresponding dimension of the crest regions. The increased dimension of the stair step structures facilitates an increased margin between conductive contact structures electrically coupled to the conductive structures and the support pillar structures. In addition, the staggered layout of the block structures facilitates an increased critical dimension of mask materials (e.g., chop mask materials) used during the formation of the stairs step regions. Further, the layout of the block structures facilitates a substantially even distribution of stresses with the stack structure after formation of the conductive structures, such as during a replacement gate process.

The microelectronic device may be formed by forming pillars including a channel material extending through a preliminary (e.g., initial) stack structure. The preliminary stack structure comprises tiers comprising alternating insulative structures and additional insulative structures. Stair step structures may be formed in the preliminary stack structure, the stair step structures horizontally spaced from horizontally neighboring stair step structures in a first horizontal direction and a second horizontal direction. Crest regions may horizontally intervene between horizontally neighboring stair step structures in the first horizontal direction. A dielectric material may be formed over the stair step structures and support pillar structures may be formed through the dielectric material and the stair step structures. Slots may be formed through the preliminary stack structure and extend generally in the first horizontal direction to define block structures, each including some of the stair step structures and some of the crest regions, the stair step structures having a greater dimension than a corresponding dimension of the crest regions. The additional insulative structures may be removed (e.g., exhumed) through the slot structures and replaced with conductive structures to form the stack structure. After forming the conductive structures, the slots may be filled with insulative material to form the slot structures, and the conductive contact structures may be formed in electrical communication with the conductive structures.

FIG. 1A through FIG. 1M illustrate a method of forming a microelectronic device structure 100, in accordance with embodiments of the disclosure. With the description provided below, it will be readily apparent to one of ordinary skill in the art that the methods and structures described herein with reference to FIG. 1A through FIG. 1L may be used in the formation and configuration of various devices and electronic systems.

FIG. 1A is a simplified partial cross-sectional view of a microelectronic device structure 100 comprising a preliminary stack structure 101 including a vertically alternating (e.g., in z-direction) sequence of insulative structures 104 and additional insulative structures 106 arranged in tiers 108.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide.

The additional insulative structures 106 may be formed of and include an insulative material exhibiting an etch selectivity with respect to the insulative structures 104. The additional insulative structures 106 may include, for example, a nitride material (e.g., silicon nitride ($Si_3N_4$)), an oxynitride material (e.g., silicon oxynitride). In some embodiments, the additional insulative structures 106 comprise a nitride material, such as silicon nitride.

Although FIG. 1A illustrates a particular number of tiers 108 of the insulative structures 104 and the additional insulative structures 106, the disclosure is not so limited. In some embodiments, the preliminary stack structure 101 includes a desired quantity of the tiers 108, such as sixty-four (64) of the tiers 108. In other embodiments, the preliminary stack structure 101 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108) of the insulative structures 104 and the additional insulative structures 106.

A lowermost one (e.g., in the Z-direction) of the insulative structures 104 may be located adjacent a source structure 110 (e.g., a common source plate (CSP)). The source structure 110 may be formed of and include, for example, a semiconductor material doped with one or more (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth). Although FIG. 1A has been described and illustrated as including the preliminary stack structure 101 directly vertically over (e.g., in the Z-direction) the source structure 110, the disclosure is not so limited. In other embodiments, the preliminary stack structure 101 overlies a deck structure comprising additional tiers 108 of insulative structures 104 and additional insulative structures 106 separated from the preliminary stack structure 101 by at least one dielectric material, such as an interdeck insulating material.

A dielectric material 112 may be located over an uppermost one (e.g., in the Z-direction) of the tiers 108. The dielectric material 112 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 112 comprises the same material composition as the insulative structures 104. In some embodiments, the dielectric material 112 comprises silicon dioxide.

Figure 1B:
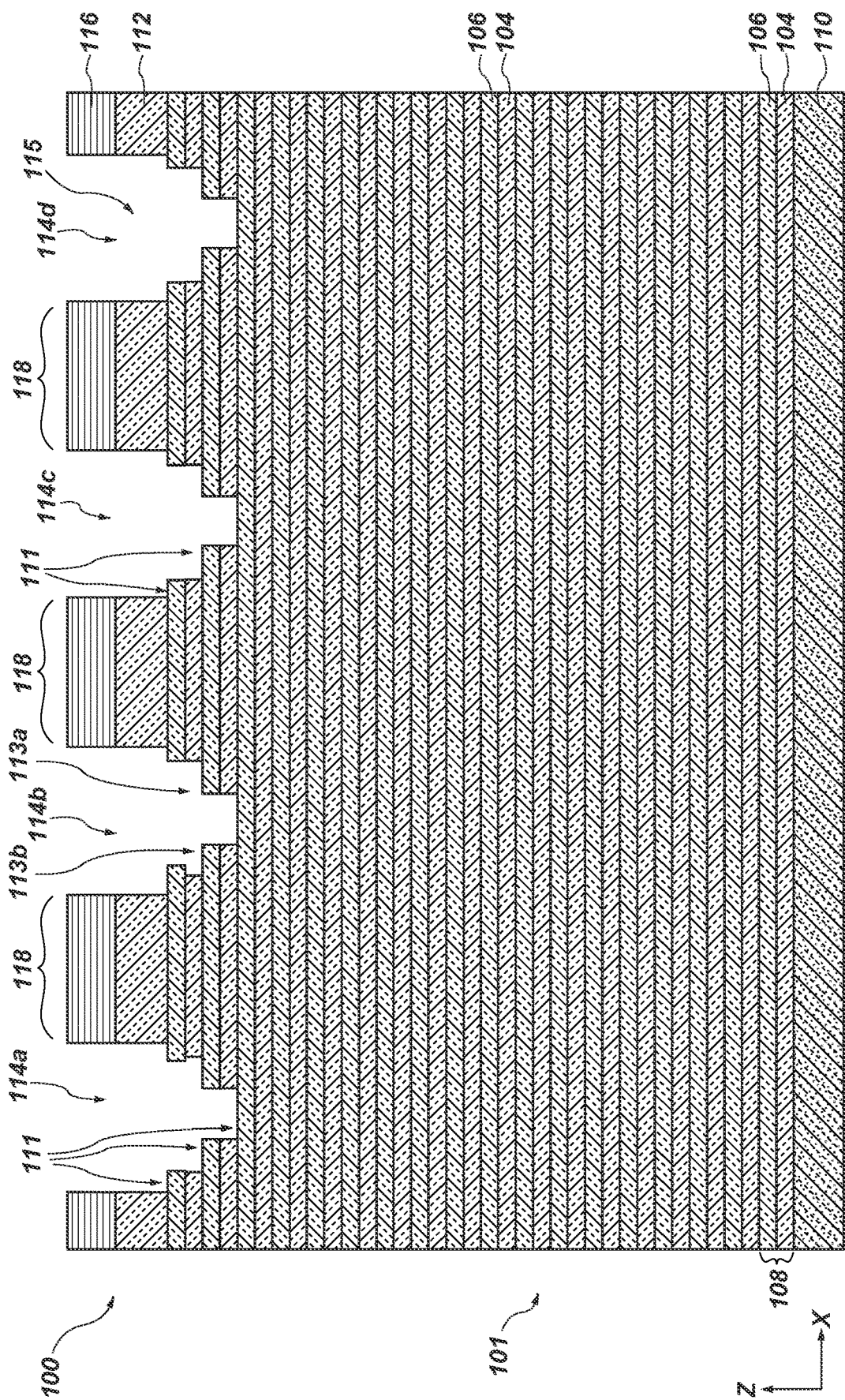
Figure 1C:
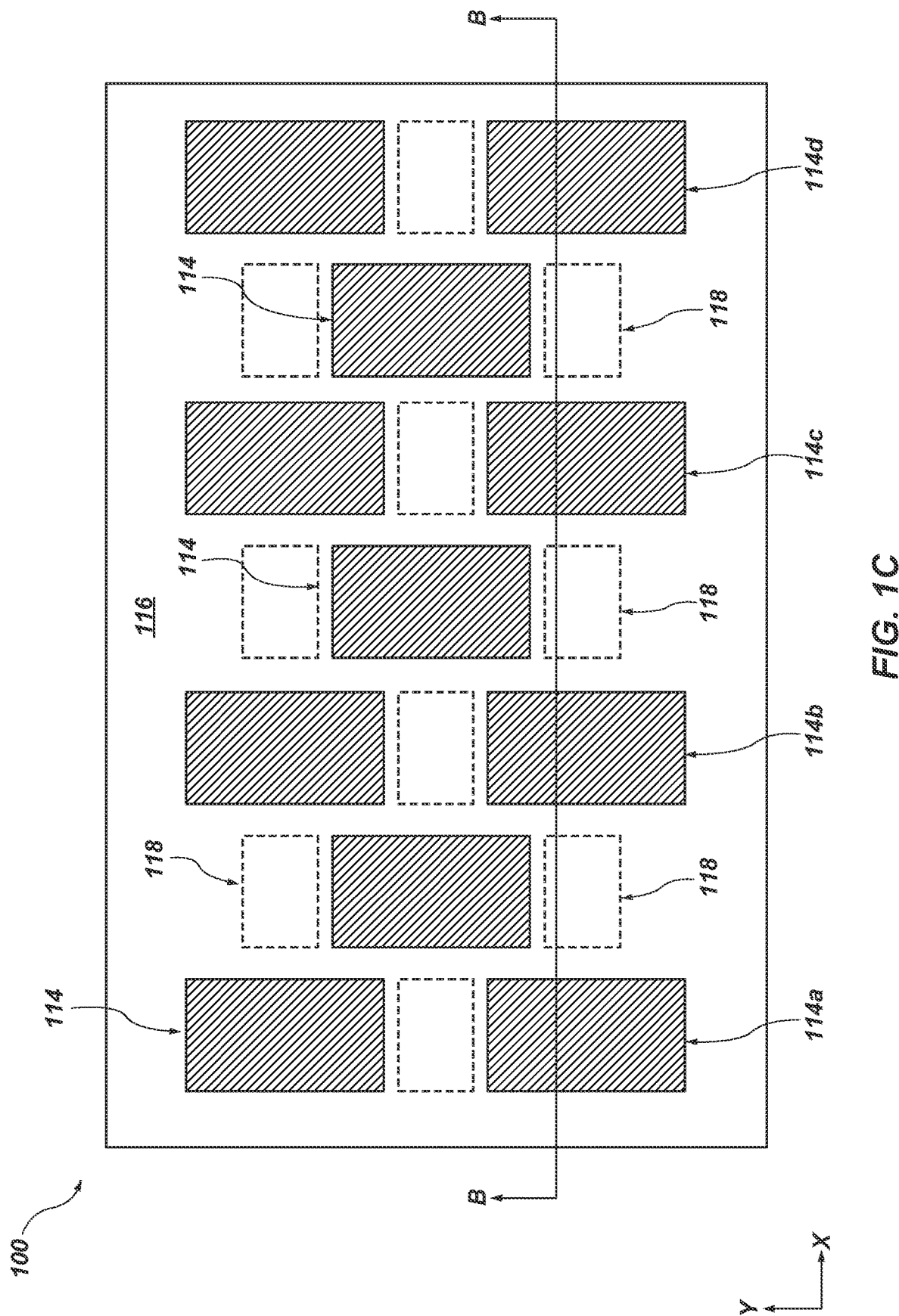

FIG. 1B and FIG. 1C illustrate the microelectronic device structure 100 after forming stair step structures 114 (e.g., first stair step structure 114*a*, second stair step structure 114*b*, third stair step structure 114*c*, and fourth stair step structure 114*d*, collectively referred to herein as stair step structures 114) (which may also be referred to herein as "staircase structures"). FIG. 1B is simplified cross-sectional views taken through section line B-B of FIG. 1D, which is a top-down view of the microelectronic device structure 100. With collective reference to FIG. 1B, the stair step structures 114 each include steps 111 defined by horizontal (e.g., lateral) edges (e.g., ends) of the tiers 108 of the insulative structures 104 and the additional insulative structures 106. Although FIG. 1B illustrates only four stair step structures 114, the disclosure is not so limited and the microelectronic device structure 100 may include fewer (e.g., one, two, three) or more (e.g., five, six, seven, eight) stair step structures 114. Each of the stair step structures 114 may be referred to herein as a so-called "stadium" since the stair step structures 114 include steps 111 facing (e.g., opposing, mirroring) one another.

The stair step structures 114 may each comprise a forward staircase structure 113*a* and a reverse staircase structure 113*b*. A phantom line extending from a top of the forward staircase structure 113*a* to a bottom of the forward staircase structure 113*a* may have a positive slope, and another phantom line extending from a top of the reverse staircase structure 113*b* to a bottom of the reverse staircase structure 113*b* may have a negative slope. The forward staircase structure 113*a* and the reverse staircase structure 113*b* of the stair step structures 114 may serve as redundant and/or alternative means of connecting to one or more of the tiers 108 of the preliminary stack structure 101 to a conductive contact structure. In additional embodiments, the stair step structures 114 exhibit a different configuration than that depicted in FIG. 1B. As a non-limiting example, the stair step structures 114 may be modified to include a forward staircase structure 113*a* but not a reverse staircase structure 113*b* (e.g., the reverse staircase structure 113*b* may be absent), or the stair step structures 114 may be modified to include a reverse staircase structure 113*b* but not a forward staircase structure 113*a* (e.g., the forward staircase structure 113*a* may be absent).

The stair step structures 114 may be formed by, for example, forming a photoresist material 116 over the microelectronic device structure 100 and forming openings through the photoresist material 116 at locations corresponding to the locations of the stair step structures 114. An uppermost tier 108 of the alternating levels of the insulative structures 104 and the additional insulative structures 106 may be exposed to etch chemistries through the openings of the photoresist material 116. After removing the uppermost tier 108 through the openings, the photoresist material 116 may be exposed to a trim chemistry to laterally remove portions of the photoresist material 116 and expose additional portions of the uppermost tier 108 corresponding to a width (in the x-direction) of a step 111. After exposing a new portion of the uppermost tier 108, the preliminary stack structure 101 is exposed to etch chemistries to remove another tier 108 through the photoresist material 116 and form another step 111 in the stair step structures 114. The process of trimming the photoresist material 116 and etching the tiers 108 may be repeated a desired number of times to form a desired number of steps 111 within the stair step structures 114.

For clarity and ease of understanding the description, FIG. 1B illustrates only a particular number of steps 111 in each stair step structure 114. However, it will be understood that the stair step structures 114 may include a greater number of steps 111 than those illustrated. For example, the stair step structures 114 may each include greater than ten (10) of the steps 111, greater than twenty (20) of the steps 111, greater than thirty (30) of the steps 111, greater than forty (40) of the steps 111, greater than fifty (50) of the steps 111, or greater than sixty (60) of the steps 111.

The stair step structures 114 may be spaced from each other by crest regions 118 (e.g., plateau regions) comprising regions of the preliminary stack structure 101 that remain substantially unremoved during formation of the stair step structures 114 (e.g., regions of the preliminary stack structure 101 covered by the photoresist material 116 during formation of the stair step structures 114). Stated another way, the crest regions 118 may include portions of the preliminary stack structure 101 that are located outside of horizontal boundaries (e.g., horizontal areas) of the stair step structures 114. The crest regions 118 are shown in broken lines in FIG. 1D for clarity and ease of understanding of the description, but it will be understood that the crest regions 118 comprise portions of the preliminary stack structure 101 outside of the stair step structures 114. In some embodiments, a horizontal dimension (e.g., in the X-direction) of the crest regions 118 may be about the same as a horizontal dimension (e.g., in the X-direction) of the stair step structures 114. In other embodiments, a horizontal dimension of the crest regions 118 is greater than a horizontal dimension of the stair step structures 114.

With reference to FIG. 1C, some of the stair step structures 114 may be horizontally offset (e.g., in the X-direction, in the Y-direction, in both the X-direction and the Y-direction) from other of the stair step structures 114 and may be horizontally aligned (e.g., in the X-direction, in the Y-direction, in both the X-direction and the Y-direction) with yet other of the stair step structures 114. Similarly, some of the crest regions 118 may be horizontally offset (e.g., in the X direction, in the Y-direction, in both the X-direction and the Y-direction) from other of the crest regions 118 and may be horizontally aligned (e.g., in the X-direction, in the Y-direction, in both the X-direction and the Y-direction) with yet other of the crest regions 118. As will be described herein, the horizontally offset (e.g., in the Y-direction) stair step structures 114 may comprise stair step structures 114 of different block structures of the microelectronic device structure 100.

Figure 1D:
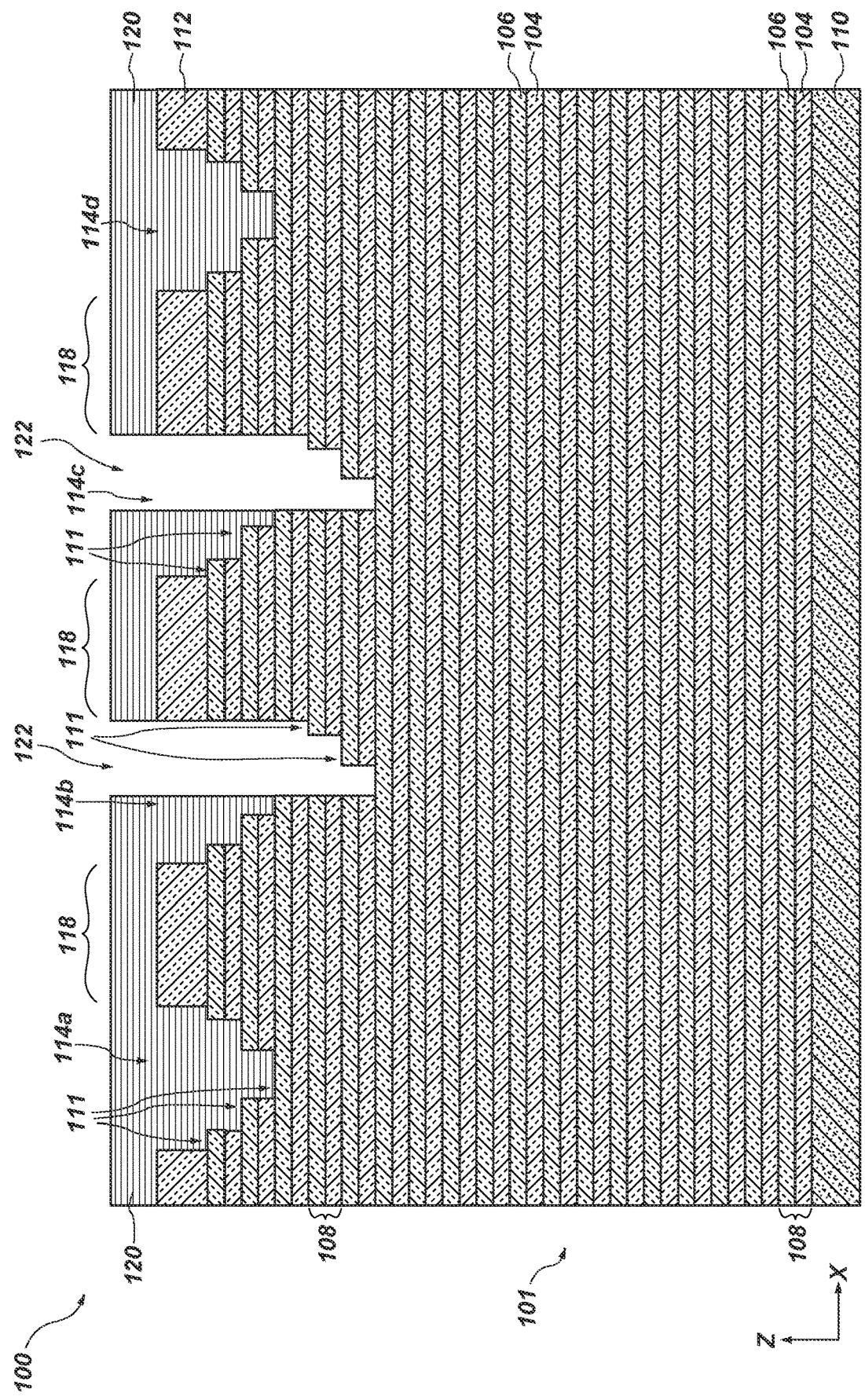

Referring next to FIG. 1D, which corresponds to the cross-section of FIG. 1B, after forming the stair step structures 114, the photoresist material 116 (FIG. 1B) may be removed from surfaces of the microelectronic device structure 100. After removing the photoresist material 116, a first chop mask material 120 may be formed over portions of the microelectronic device structure 100, such as over and within some of the stair step structures 114 and over the crest regions 118.

Openings 122 may be formed through the first chop mask material 120 over some of the stair step structures 114, such as the second stair step structure 114b and the third stair step structure 114c. The openings 122 may expose, for example, only a portion of (e.g., about half of) the stair step structures 114. For example, about one half of the second stair step structure 114b and about one-half of the third stair step structure 114c may be exposed through an opening 122 while the remaining about one-half of the respective second stair step structure 114b and the third stair step structure 114c are covered by the first chop mask material 120. In some embodiments, only some of the stair step structures 114 are at least partially exposed through the openings 122 of the first chop mask material 120. In some embodiments, stair step structures 114 other than horizontally terminal (e.g., in the X-direction) stair step structures 114 (e.g., the first stair step structure 114a and the fourth stair step structure 114d) may be at least partially exposed through the openings 122 of the first chop mask material 120. Stated another way, the horizontally central stair step structures 114 may be at least partially exposed through the openings 122 while the horizontally end stair step structures 114 are substantially completely covered by the mask material 120.

With continued reference to FIG. 1D, the second stair step structure 114b and the third stair step structure 114c may be exposed to etch chemistries to remove additional tiers 108 of the insulative structures 104 and the additional insulative structures 106 through the openings 122. In some embodiments, partially exposing the stair step structures 114 to the etch chemistries through the openings 122 in the first chop mask material 120 may vertically offset (e.g., in the Z-direction) steps 111 of the forward staircase structure 113a of the stair step structures 114 from the steps 111 of the reverse staircase structure 113b. For example, the second stair step structure 114b and the third stair step structure 114c may each individually include steps 111 that are vertically offset (e.g., in the Z-direction) from other of the steps 111 of the respective second stair step structure 114b and the third stair step structure 114c. In some such embodiments, steps 111 of the forward staircase structure 113a may be vertically offset (e.g., in the Z-direction) from steps 111 of the reverse staircase structure 113b in the second stair step structure 114b and the third stair step structure 114c. In some embodiments, at least some (e.g., all) of the steps 111 of the forward staircase structure 113a are vertically aligned (e.g., in the Z-direction) with at least some (e.g., all) of the steps 111 of the reverse staircase structure 113b of the first stair step structure 114a and the reverse staircase structure 113b of the second stair step structure 114b.

Figure 1E:
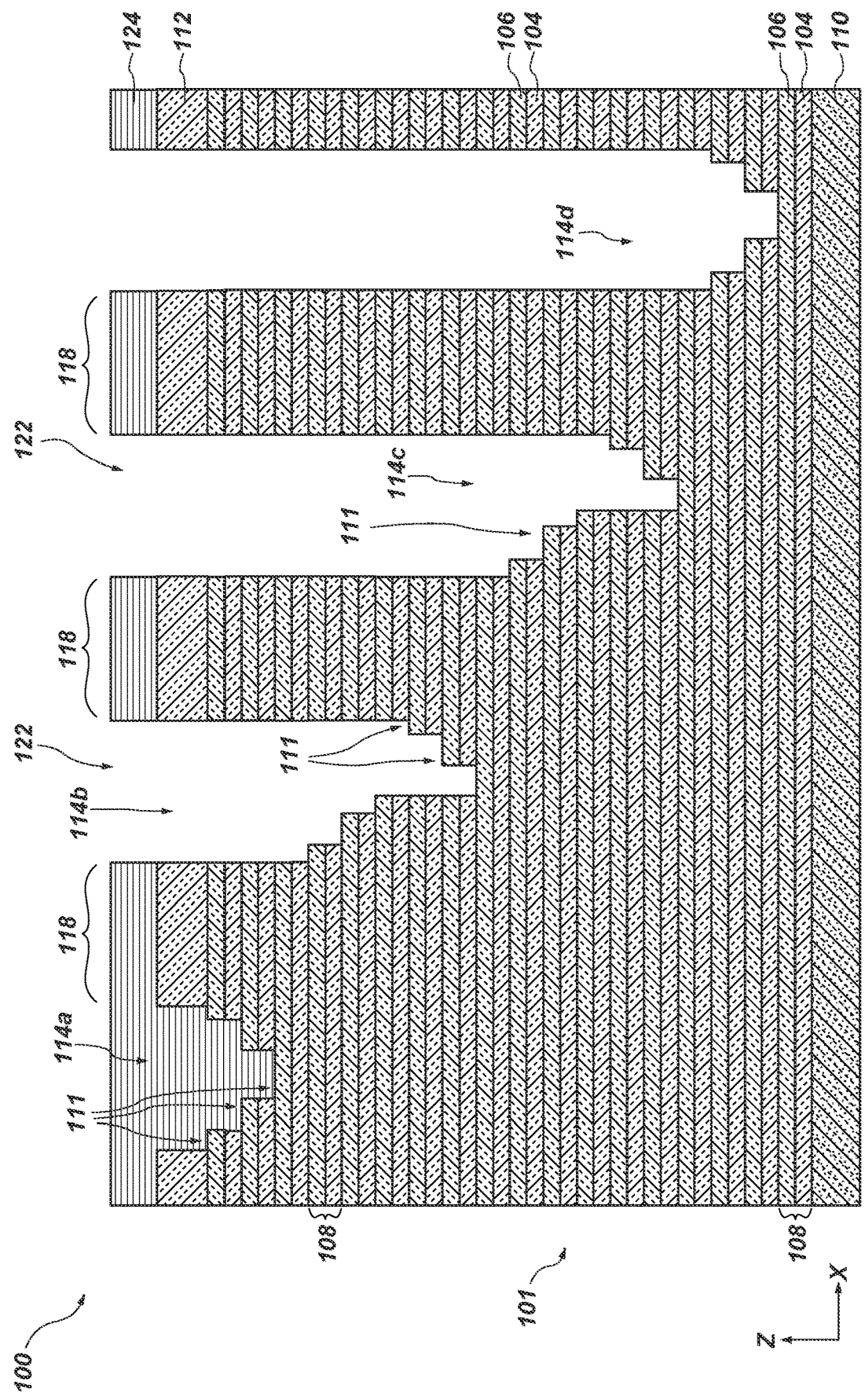

Referring now to FIG. 1E, which is a simplified cross-sectional view of the microelectronic device structure 100 taken through the same cross-section as FIG. 1D, the first chop mask material 120 (FIG. 1D) may be removed from the microelectronic device structure 100 and a second chop mask material 124 may be formed over portions of the microelectronic device structure 100. For example, the second chop mask material 124 may be formed over the microelectronic device structure 100 and openings may be formed through the second chop mask material 124 at locations corresponding to the second stair step structure 114b, the third stair step structure 114c, and the fourth stair step structure 114d.

Exposed portions of the tiers 108 of the insulative structures 104 and the additional insulative structures 106 may sequentially be removed by exposure to one or more etching chemistries, as described above. In some embodiments, a first number of the tiers 108 is removed to reposition the second stair step structure 114b vertically (e.g., in the Z-direction) lower than the first stair step structure 114a.

After forming the second stair step structure 114b, a mask material (e.g., a third chop mask material) is formed over the second stair step structure 114b and the first stair step structure 114a (e.g., the second chop mask material 124 is removed and the third mask material is formed over the first stair step structure 114a and the second stair step structure 114b; the second chop mask material 124 remains over the first stair step structure 114a and the third mask material is formed over the second stair step structure 114b) and additional tiers 108 may be removed within horizontal boundaries of exposed portions of the third stair step structure 114c and the fourth stair step structure 114d. In some embodiments, a number of the tiers 108 are removed to reposition the third stair step structure 114c vertically (e.g., in the Z-direction) lower than the first stair step structure 114a and the second stair step structure 114b. After forming the third stair step structure 114c, a mask material (e.g., a fourth chop mask material) may be formed over the third stair step structure 114c and additional tiers 108 may be removed within horizontal boundaries of exposed portions of the fourth stair step structure 114d to reposition the fourth stair step structures 114d vertically (e.g., in the Z-direction) lower than the first stair step structure 114a, the second stair step structure 114b, and the third stair step structure 114c.

In some embodiments, steps 111 of each of the first stair step structure 114a, the second stair step structure 114b, the third stair step structure 114c, and the fourth stair step structure 114d may be vertically offset from the steps 111 of the others of the first stair step structure 114a, the second stair step structure 114b, the third stair step structure 114c, and the fourth stair step structure 114d.

Although FIG. 1A through FIG. 1E have been described and illustrated as forming the stair step structures 114 in a particular order (e.g., removing tiers 108 from regions corresponding to each of first stair step structure 114a, the second stair step structure 114b, the third stair step structure 114c, and the fourth stair step structure 114d followed by removal of additional tiers 108 through openings in one or more chop masks) the disclosure is not so limited. In other embodiments, one or more chop masks may be formed over one or more regions of the microelectronic device structure 100 corresponding to locations of the first stair step structure 114a, the second stair step structure 114b, the third stair step structure 114c, and the fourth stair step structure 114d and the tiers 108 may be removed through openings in the one or more chop masks. After removing the tiers 108, an additional mask material may be formed over the microelectronic device structure 100 and the microelectronic device structure may be sequentially exposed to a trimming chemistry to laterally remove a portion of the additional mask followed by exposure of the tiers 108 to etch chemistries to remove exposed portions of the tiers 108 to form the stair step structures. The microelectronic device structure 100 may be exposed to a desired number of cycles of the trimming chemistries and etch chemistries to remove the materials of the tiers 108 to form stair step structures 114 having a desired profile.

Figure 1F:
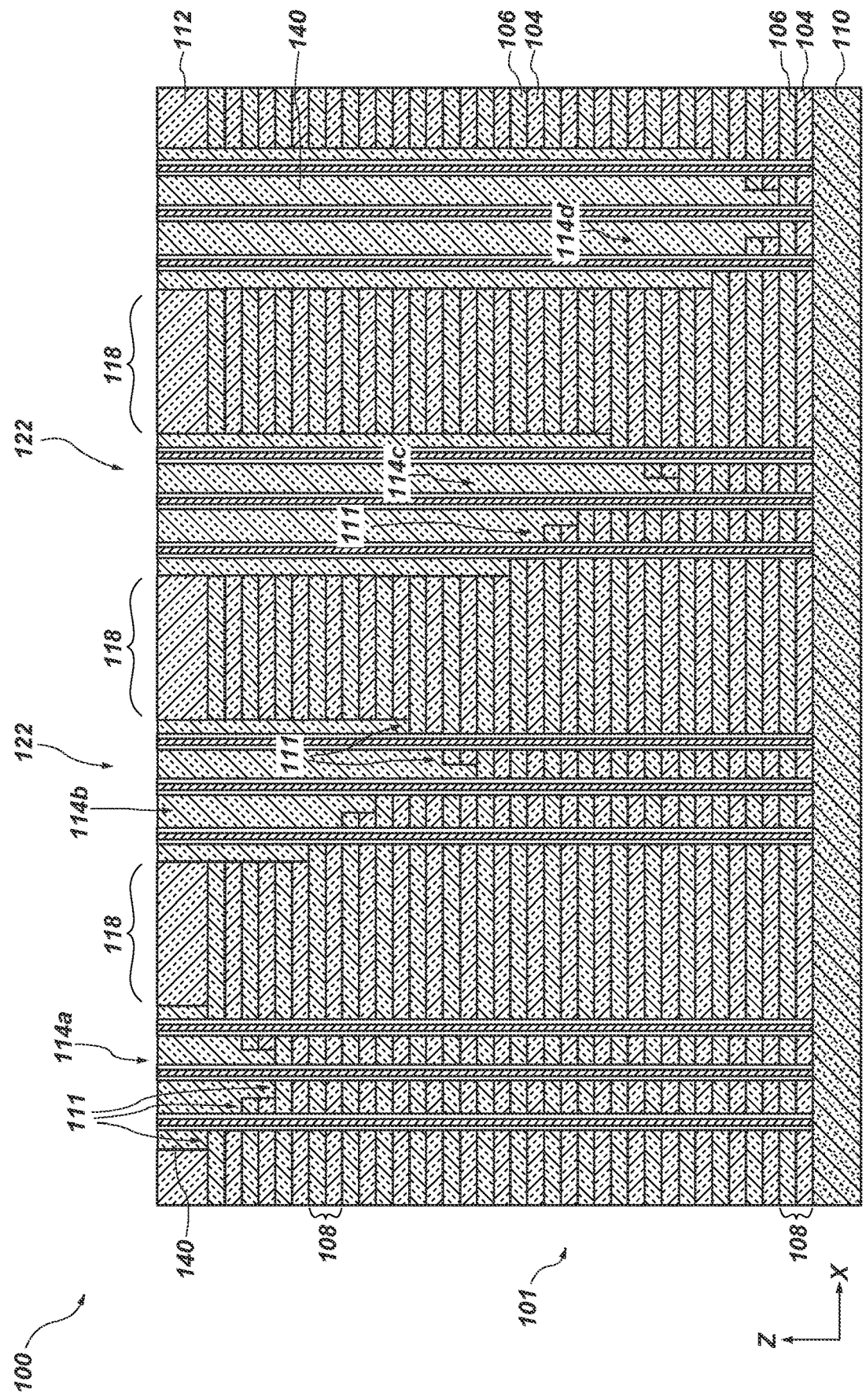
Figure 1G:
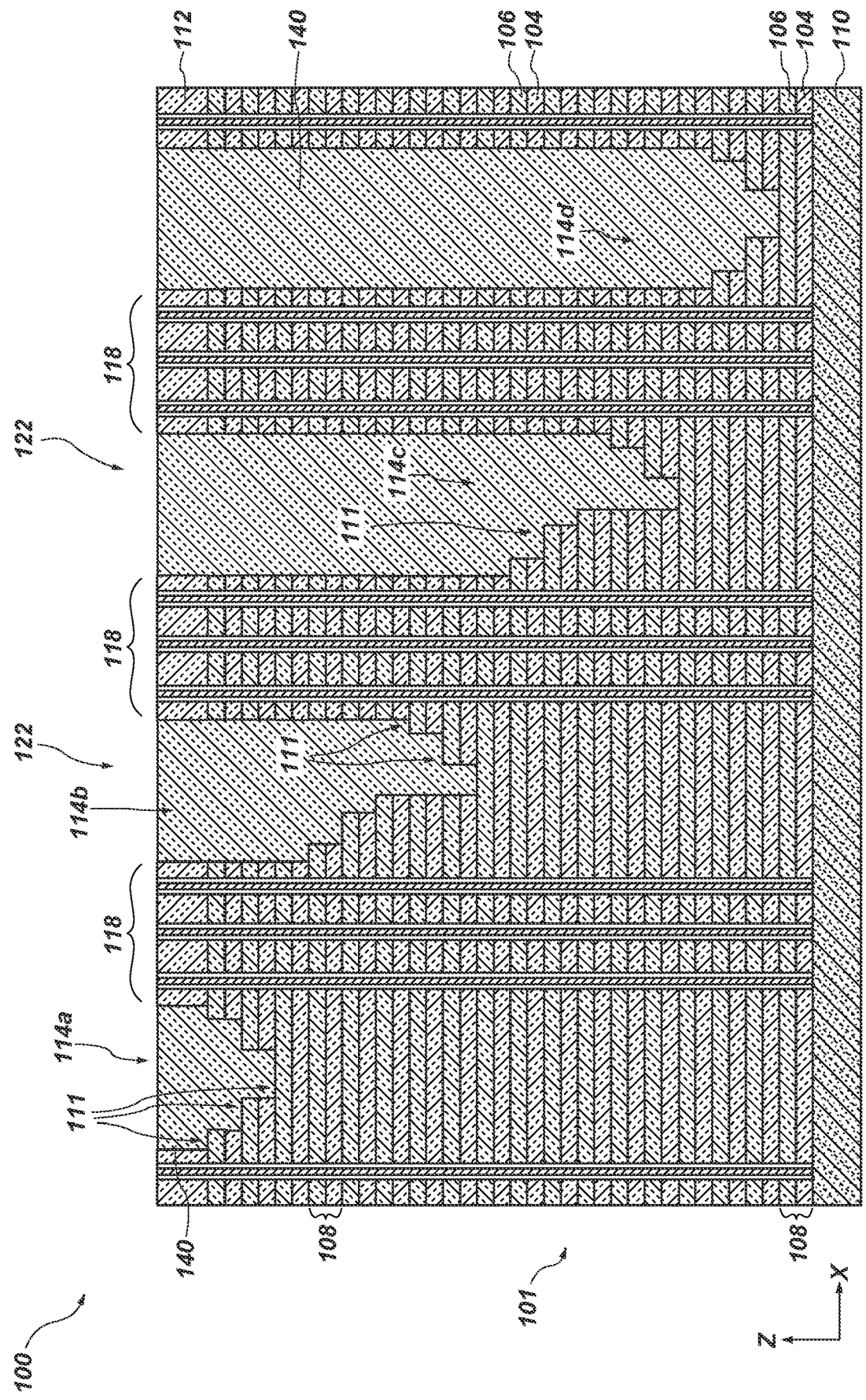
Figure 1H:
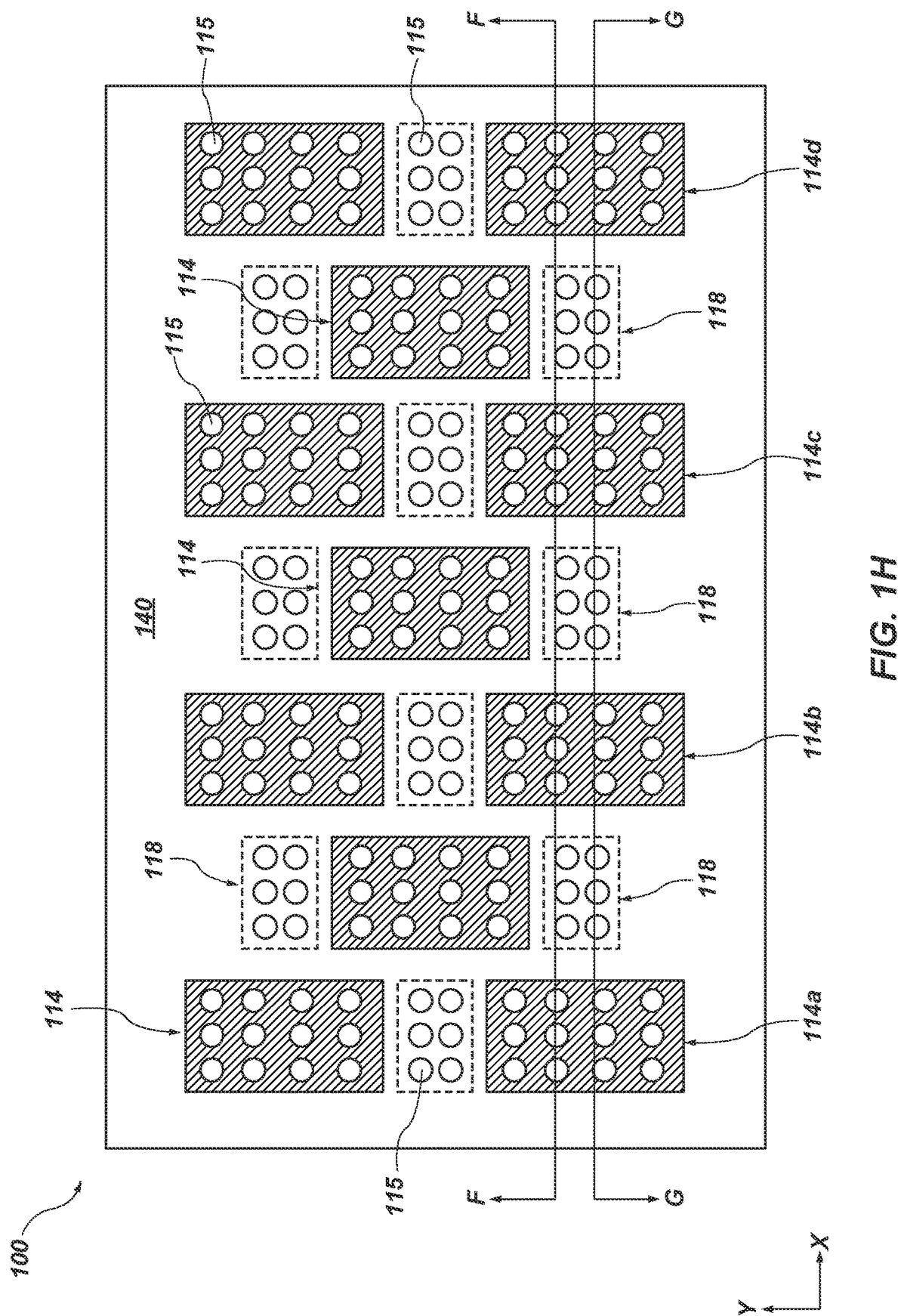
Figure 11:
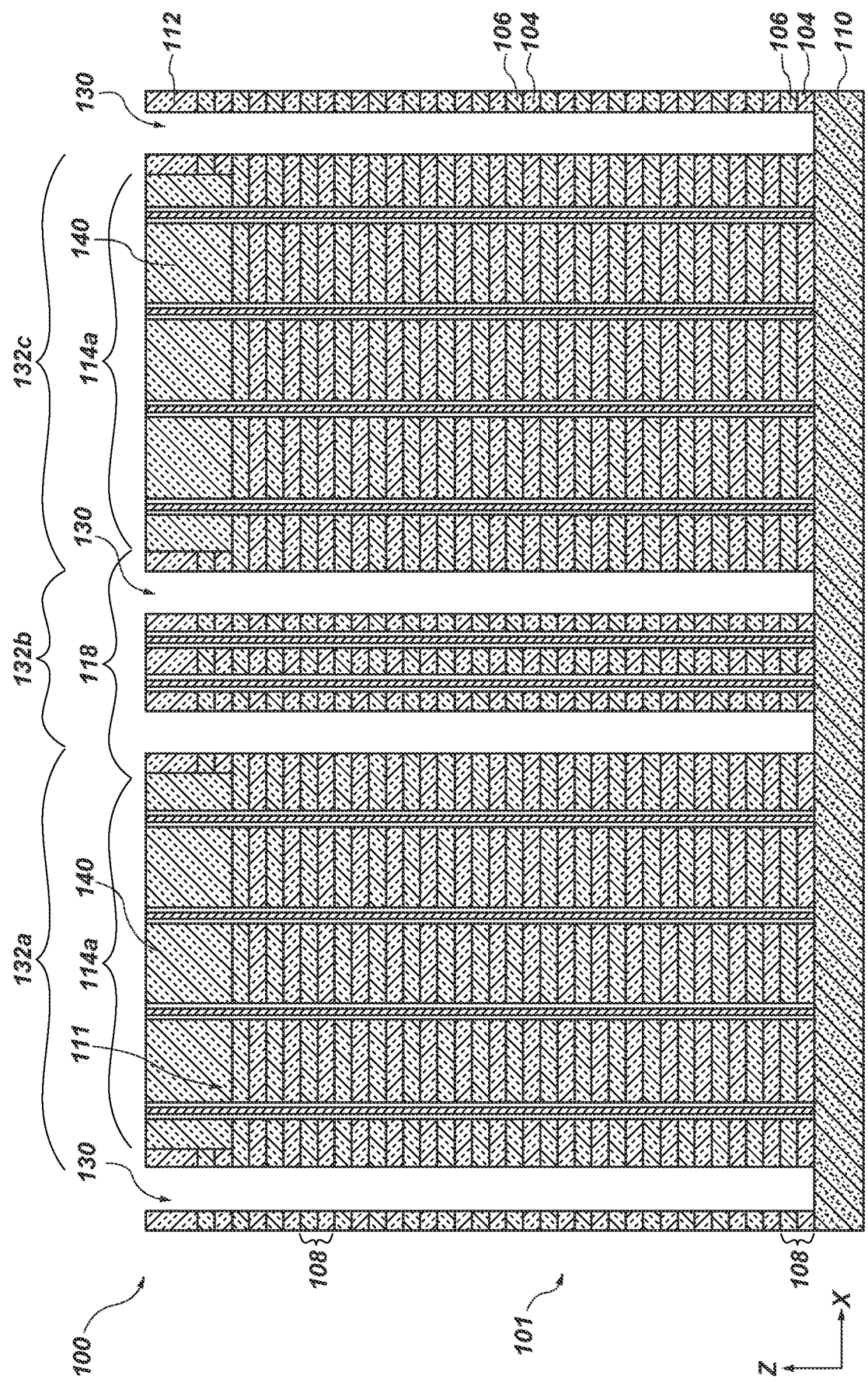

With reference to FIG. 1F through FIG. 1H, after forming the stair step structures 114, a dielectric material 140 may be formed over the stair step structures 114. FIG. 1F is a simplified cross-sectional view of the microelectronic device structure 100 taken through section line F-F of FIG. 1H, which is a simplified top-down view of the microelectronic device structure 100. FIG. 1G is a simplified cross-sectional view of the microelectronic device structure 100 of FIG. 1H taken through section line G-G of FIG. 1H. Dielectric material 140 outside of the stair step structures 114 may be removed by exposing the microelectronic device structure 100 to a planarization process, such as a chemical mechanical planarization (CMP) process.

The dielectric material 140 may include insulative material. In some embodiments, the dielectric material 140 includes one or more of the materials described above with reference to the insulative structures 104. In some embodiments, the dielectric material 140 comprises substantially the same material composition as the dielectric material 140. In some embodiments, the dielectric material 140 comprises silicon dioxide.

After forming the dielectric material 140, support pillar structures 115 may be formed through the dielectric material 140, the stack structure 101, and the stair step structures 114. The support pillar structures 115 may each comprise a first material 117 vertically extending through the dielectric material 140, the stack structure 101, and the stair step structures 114 and to or into the source structure; and a liner material 119 on sidewalls of the first material 117. The liner material 119 may substantially surround (e.g., substantially horizontally and vertically cover) sidewalls of the first material 117.

The first material 117 may be formed of and include at least one conductive material, such as such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the first material 117 of each of the support pillar structures 115 has substantially the same material composition.

In other embodiments, the first material 117 is formed of and includes an insulative material. In some such embodiments, the first material 117 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 117 comprise $SiO_2$. In some embodiments, such as where the first material 117 comprises an insulative material, the microelectronic device structure 100 may not include the liner material 119 on sidewalls of the first material 117 and the support pillar structures 115 may comprise only the first material 117 (e.g., the insulative material).

The support pillar structures 115 may each individually exhibit a desired geometric configuration (e.g., dimensions and shape) and spacing. The geometric configurations and spacing of the support pillar structures 115 may be selected at least partially based on the configurations and positions of other components (e.g., steps of a stair step structure to be formed, conductive contact structures to be formed in contact with the steps of the stair step structure, the source structure 110) of the microelectronic device structure 100. For example, the support pillar structures 115 may each individually have a geometric configuration and spacing permitting the support pillar structure 115 to vertically-extend (e.g., in the Z-direction) through the preliminary stack structure 101 and physically contact (e.g., land on) a structure of the source structure 110 to facilitate a predetermined function (e.g., an electrical interconnection function, a support function) of the support pillar structure 115. In other embodiments, the support pillar structures 115 do not include an electrical interconnection function and serves a support function. Each of the support pillar structures 115 may exhibit substantially the same geometric configuration (e.g., the same dimensions and the same shape) and horizontal spacing (e.g., in the X-direction) as each other of the support pillar structures 115, or at least some of the support pillar structures 115 may exhibit a different geometric configuration (e.g., one or more different dimensions, a different shape) and/or different horizontal spacing than at least some other of the support pillar structures 115. In some embodiments, the support pillar structures 115 are at least partially uniformly spaced in the X-direction. In other embodiments, the support pillar structures 115 are at least partially non-uniformly spaced in the X-direction.

The support pillar structures 115 may serve as support structures during and/or after the formation of one or more components of the microelectronic device structure 100. For example, the support pillar structures 115 may serve as support structures for the formation of the conductive structures during replacement of the additional insulative structures 106 with conductive structures, as will be described herein using so called "replacement gate" or "gate last" processing acts.

The liner material 119 may be horizontally interposed between each of the first materials 117 of the support pillar structures 115 and the tiers 108 of the preliminary stack structure 101. Stated another way, the liner material 119 may horizontally surround the first material 117. The liner material 119 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 119 comprises Sift. In some embodiments, the liner material 119 has a different material composition as the insulative structure 104. In other embodiments, the liner material 119 has the same material composition as the insulative structure 104. In some embodiments, the liner material 119 comprises a material composition that is not substantially removed responsive to exposure to etch chemistries formulated and configured to remove silicon nitride.

With continued reference to FIG. 1H, at least some of the support pillar structures 115 may be horizontally aligned (e.g., in the X-direction, in the Y-direction, in both the X-direction and the Y-direction) with others of the support pillar structures 115 (e.g., in the X-direction, in the Y-direction, in both the X-direction and the Y-direction) and horizontally offset (e.g., in the X-direction, in the Y-direction, in both the X-direction and the Y-direction) from yet other of the support pillar structures 115. In some embodiments, the support pillar structures 115 within the horizontal boundaries of stair step structures 114 are horizontally offset (e.g., in the X-direction and the Y-direction) from the support pillar structures 115 within horizontal boundaries of the crest regions 118. In other embodiments, the support pillar structures 115 in the stair step structures 114 are horizontally aligned with the support pillar structures 115 in the crest regions 118.

In some embodiments, each stair step structure 114 may include about four (4) rows of support pillar structures 115 within the horizontal area of the stair step structure 114. The rows of the support pillar structures 115 may be arranged in a horizontal direction (e.g., the Y-direction) perpendicular to the direction in which the steps 111 extend (e.g., the X-direction).

Figure 1J:
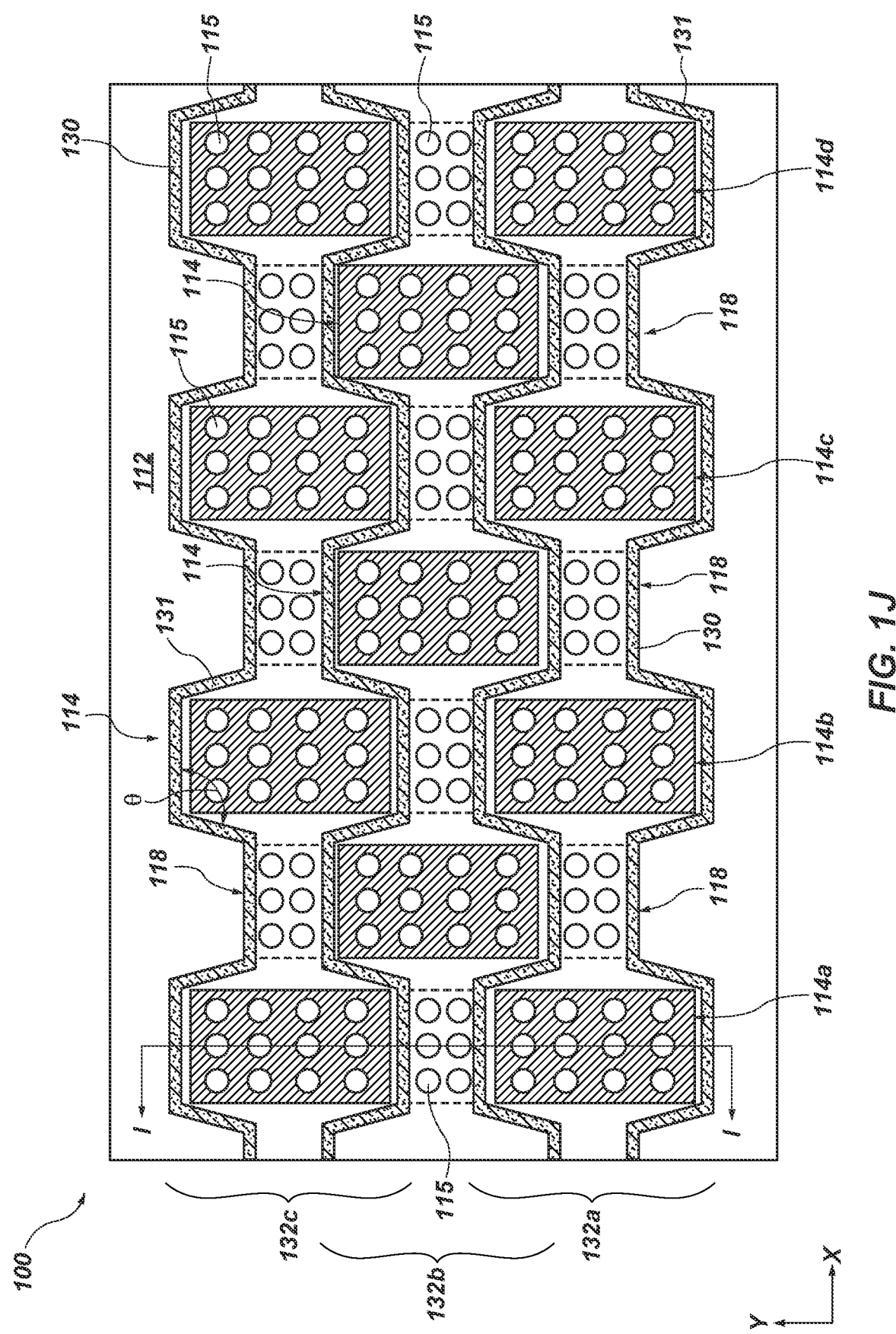

With reference to FIG. 1I and FIG. 1J, after forming the stair step structures 114 at desired elevations (e.g., in the Z-direction) within the preliminary stack structure 101, slots 130 (also referred to herein as "replacement gate slots") may be formed to extend through the dielectric material 112 and the preliminary stack structure 101 of the microelectronic device structure 100. FIG. 1I is a simplified cross-sectional view of the microelectronic device structure 100 of FIG. 1J taken through section line I-I of FIG. 1J.

Referring to FIG. 1J, the slots 130 may extend in a horizontal direction (e.g., in the X-direction). The slots 130 may separate the microelectronic device structure 100 into one or more block structures 132, individually positioned horizontally (e.g., in the Y-direction) between horizontally neighboring slots 130. For example, the slots 130 may divide the microelectronic device structure 100 into a first block structure 132a, a second block structure 132b, and a third block structure 132c. Each of the block structures 132 may horizontally overlap each other (e.g., in the Y-direction). Stated another way, in some embodiments, at least a portion of each block structure 132 may be located within horizontal boundaries of others of the block structures 132 horizontally neighboring the block structure 132. In addition, at least another portion of each block structure 132 may be located outside of horizontal boundaries of others of the block structures 132 horizontally neighboring the block structure 132. For example, portions of the second block structure 132b may be located within horizontal boundaries of the first block structure 132a and the third block structure 132c; and additional portions of the second block structure 132b may be located outside of the horizontal boundaries of the first block structure 132a and the third block structure 132c. By way of non-limiting example, the stair step structures 114 of each block structure 132 may be located within horizontal boundaries of other of the block structures 132 horizontally neighboring the block structure 132. Although FIG. 1J illustrates three block structures 132, the disclosure is not so limited and the microelectronic device structure 100 may include a greater number (e.g., more than three, more than four, more than six, more than eight) of the block structures 132.

The slots 130 may individually exhibit a non-linear shape. The slots 130 may include one or more arcuate (e.g., curved surfaces). In some embodiments, each slot 130 includes at least one portion oriented at an angle other than about zero from at least another portion of the slot 130. In some embodiments, the slots 130 include one or more angled portions 131 configured such that the slots 130 extend around edges of the stair step structures 114 and the crest regions 118. The one or more angled portions 131 may connect horizontally extending (e.g., in the X-direction) portions of the slots 130 extending horizontally along a perimeter of the stair step structures 114 and the crest regions 118. In some embodiments, the slots 130 extend around a perimeter of block structures 132 having stair step structures 114 having a greater lateral dimension than the crest regions 118.

An angle θ between a portion of the slot structure 130 between the stair step structures 114 and the crest regions 118 may be within a range from about 90 degrees and about 150 degrees, such as from about 90 degrees to about 110 degrees, from about 110 degrees to about 130 degrees, or from about 130 degrees to about 150 degrees. In some embodiments, the angle θ is greater than 90 degrees and less than 180 degrees. In some embodiments, the angle θ is selected to facilitate a desired horizontal distance between the slot structure 130 and the neighboring block structures 132 and a horizontal spacing (e.g., in the Y-direction) between neighboring block structures 132.

With continued reference to FIG. 1I and FIG. 1J, in some embodiments, a spacing (e.g., in the Y-direction) between horizontally neighboring support pillar structures 115 within the stair step structures 114 is different than a spacing between horizontally neighboring support pillar structures 115 within the crest regions 118. For example, the spacing between horizontally neighboring support pillar structures 115 within horizontal boundaries of the stair step structures 114 may be greater than the spacing between horizontally neighboring support pillar structures 115 within horizontal boundaries of the crest regions 118.

A number of support pillar structures 115 within horizontal boundaries of the stair step structures 114 may be greater than a number of the support pillar structures 115 within horizontal boundaries of the crest regions 118. In some embodiments, the crest regions 118 may include about one-half as many support pillar structures 115 as the stair step structures 114.

In some embodiments, support pillar structures 115 within horizontal boundaries of the stair step structures 114 of a block structure are horizontally aligned (e.g., in the Y-direction) with support pillar structures 115 within horizontal boundaries of the crest regions 118 of the same block structure 132. In other embodiments, support pillar structures 115 within horizontal boundaries of the stair step structures 114 of a block structure are horizontally offset (e.g., in the Y-direction) with support pillar structures 115 within horizontal boundaries of crest regions 118 of the same block structure 132. The support pillar structures 115 within horizontal boundaries of the stair step structures 114 of a first block structure 132a may be horizontally aligned (e.g., in the X-direction) with the support pillar structures 115 within horizontal boundaries of a crest region 118 of a horizontally neighboring (e.g., in the Y-direction) block structure 132. In other embodiments, support pillar structures 115 within horizontal boundaries of the stair step structures 114 of a first block structure 132a may be horizontally offset (e.g., in the X-direction) with the support pillar structures 115 within horizontal boundaries of a crest region 118 of a horizontally neighboring (e.g., in the Y-direction) block structure 132.

In some embodiments, a horizontal area of the stair step structures 114 may be greater than area horizontal area of the crest regions 118. In other words, the stair step structures 114 may constitute a larger portion of the block structures 132 than the crest regions 118.

In some embodiments, each of the block structures 132 may be substantially the same. In some embodiments, every other block structure 132 may be horizontally aligned (e.g., in the X-direction) with other block structures 132 (e.g., in the Y-direction) and may be horizontally offset from horizontally neighboring (e.g., in the Y-direction) block structures 132. For example, the first block structure 132a may be horizontally aligned (e.g., in the X-direction) with the third block structure 132c and may be horizontally offset from the second block structure 132b. Stated another way, the block structures 132 may be staggered with each other. Staggering the block structures 132 may facilitate an increased spacing between the support pillar structures 115 and conductive contact structures to be formed within the stair step structures 114 of the block structures 132 compared to conventional microelectronic device structures. In addition, the staggered block structures 132 may facilitate an increased number of the support pillar structures 115 within a given area compared to conventional microelectronic device structures. In some embodiments, the microelectronic device structure 100 is substantially symmetrical. In other words, the block structures 132 may be arranged to exhibit a substantially symmetrical arrangement.

With continued reference to FIG. 1J, the stair step structures 114 of a block structure 132 are horizontally aligned (e.g., in the X-direction) with the crest regions 118 of horizontally neighboring (e.g., in the Y-direction) block structures 132 and horizontally aligned in the same direction (e.g., in the X-direction) with the stair step structures 114 of every other block structure 132. For example, the stair step structures 114 of the first block structure 132a are horizontally aligned (e.g., in the X-direction) with the crest regions 118 of the second block structure 132b and are also horizontally aligned (e.g., in the X-direction) with the stair step structures 114 of the third block structure 132c. In addition, the crest regions 118 of a block structure 132 are horizontally aligned (e.g., in the X-direction) with the stair step structures 114 of horizontally neighboring (e.g., in the Y-direction) block structures 132 and are also horizontally aligned in the same direction (e.g., in the X-direction) with crest regions 118 of every other block structure 132. For example, the crest regions 118 of the first block structure 132a are horizontally aligned (e.g., in the X-direction) with the stair step structures 114 of the second block structure 132b and are also horizontally aligned (e.g., in the X-direction) with the crest regions 118 of the third block structure 132c.

In some embodiments, at least a portion of the stair step structures 114 of a block structure 132 is located within horizontal boundaries of stair step structures 114 of a horizontally neighboring (e.g., in the Y-direction) block structure 132.

In some embodiments, each of the crest regions 118 is horizontally surrounded by (e.g., in the X-direction) stair step structures 114 of the same block structure 132 and is horizontally surrounded (e.g., in the Y-direction) by stair step structures 114 of horizontally neighboring block structures 132. Similarly, stair step structure 114 of a block structure 132 may be horizontally surrounded by (e.g., in the X-direction) crest regions 118 of the same block structure 132 and may be horizontally surrounded (e.g., in the Y-direction) by crest regions 118 of horizontally neighboring block structures 132.

Figure 1K:
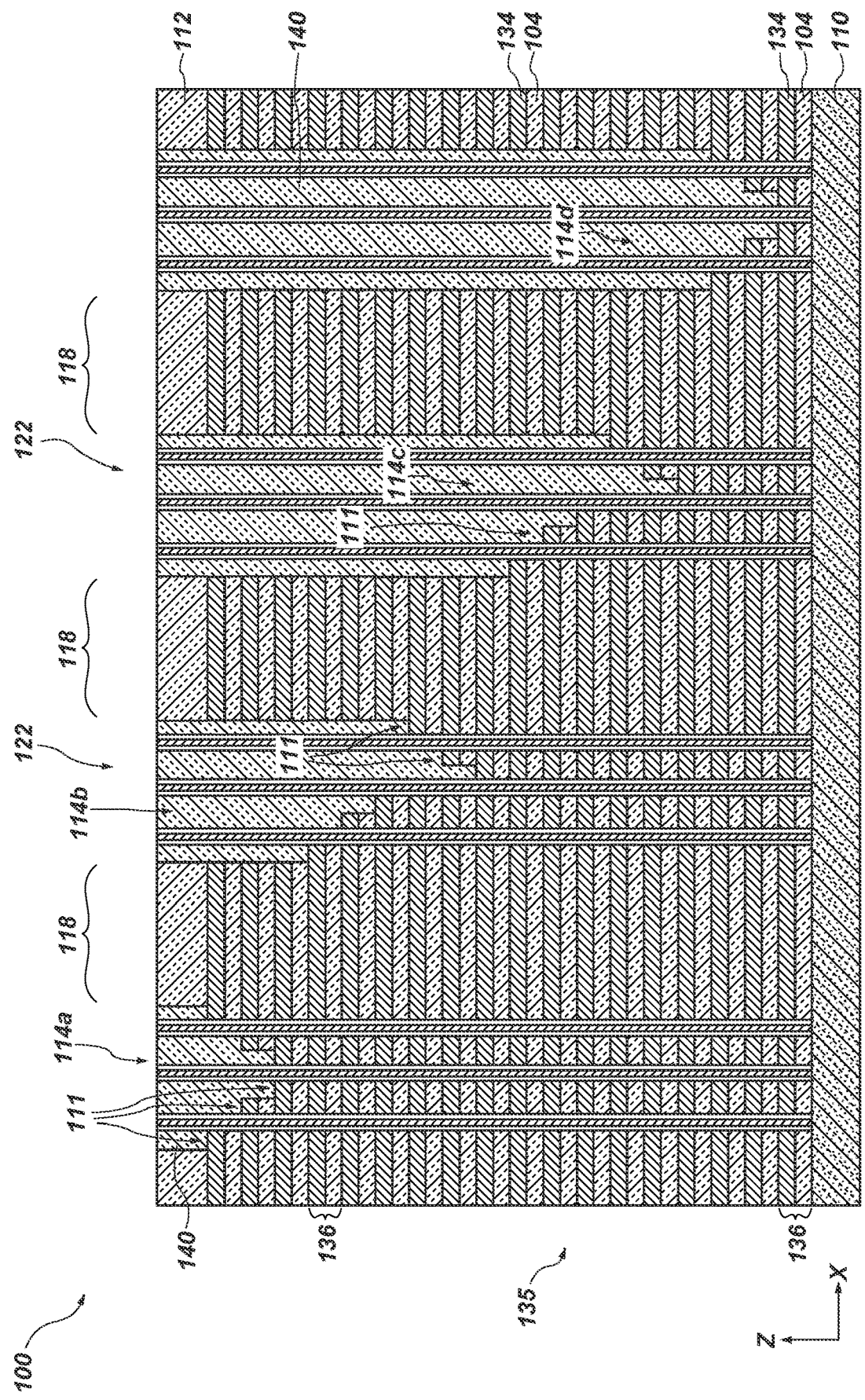

Referring now to FIG. 1K, the microelectronic device structure 100 may be subjected to replacement gate processing to remove the additional insulative structures 106 (FIG. 1I) through the slots 130 and replace the additional insulative structures 106 with conductive structures 134 to form a stack structure 135 including tiers 136 of the insulative structures 104 and the conductive structures 134. For example, the additional insulative structures 106 may be selectively removed (e.g., exhumed) through the slots 130. Thereafter, open volumes (e.g., void spaces) formed by the removed portions of the additional insulative structures 106 may be filled with a conductive material to form the conductive structures 134. The support pillar structures 115 may impede (e.g., prevent) tier collapse during the selective removal of the additional insulative structures 106.

The conductive structures 134 of the tiers 136 of the stack structure 135 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive structures 134 are formed of and include tungsten.

Each of the conductive structures 134 may individually include a substantially homogeneous distribution of the at least one conductive material, or a substantially heterogeneous distribution of the at least one conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 134 of each of the tiers 136 of the stack structure 135 exhibits a substantially homogeneous distribution of conductive material. In additional embodiments, at least one of the conductive structures 134 of at least one of the tiers 136 of the stack structure 135 exhibits a substantially heterogeneous distribution of at least one conductive material. The conductive structure 134 may, for example, be formed of and include a stack of at least two different conductive materials. The conductive structures 134 of each of the tiers 136 of the stack structure 135 may each be substantially planar, and may each exhibit a desired thickness.

In some embodiments, the conductive structures 134 may include a conductive liner material around the conductive structures 134, such as between the conductive structures 134 and the insulative structures 104. The conductive liner material may comprise, for example, a seed material from which the conductive structures 134 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

At least one lower conductive structure 134 of the stack structure 135 may be employed as at least one lower select gate (e.g., at least one source side select gate (SGS)) of the microelectronic device structure 100. In some embodiments, a single (e.g., only one) conductive structure 134 of a vertically lowermost tier 136 of the stack structure 135 is employed as a lower select gate (e.g., a SGS) of the microelectronic device structure 100. In addition, upper conductive structure(s) 134 of the stack structure 135 may be employed as upper select gate(s) (e.g., drain side select gate(s) (SGDs)) of the microelectronic device structure 100. In some embodiments, horizontally-neighboring conductive structures 134 of a vertically uppermost tier 136 of the stack structure 135 are employed as upper select gates (e.g., SGDs) of the microelectronic device structure 100.

Figure 1L:
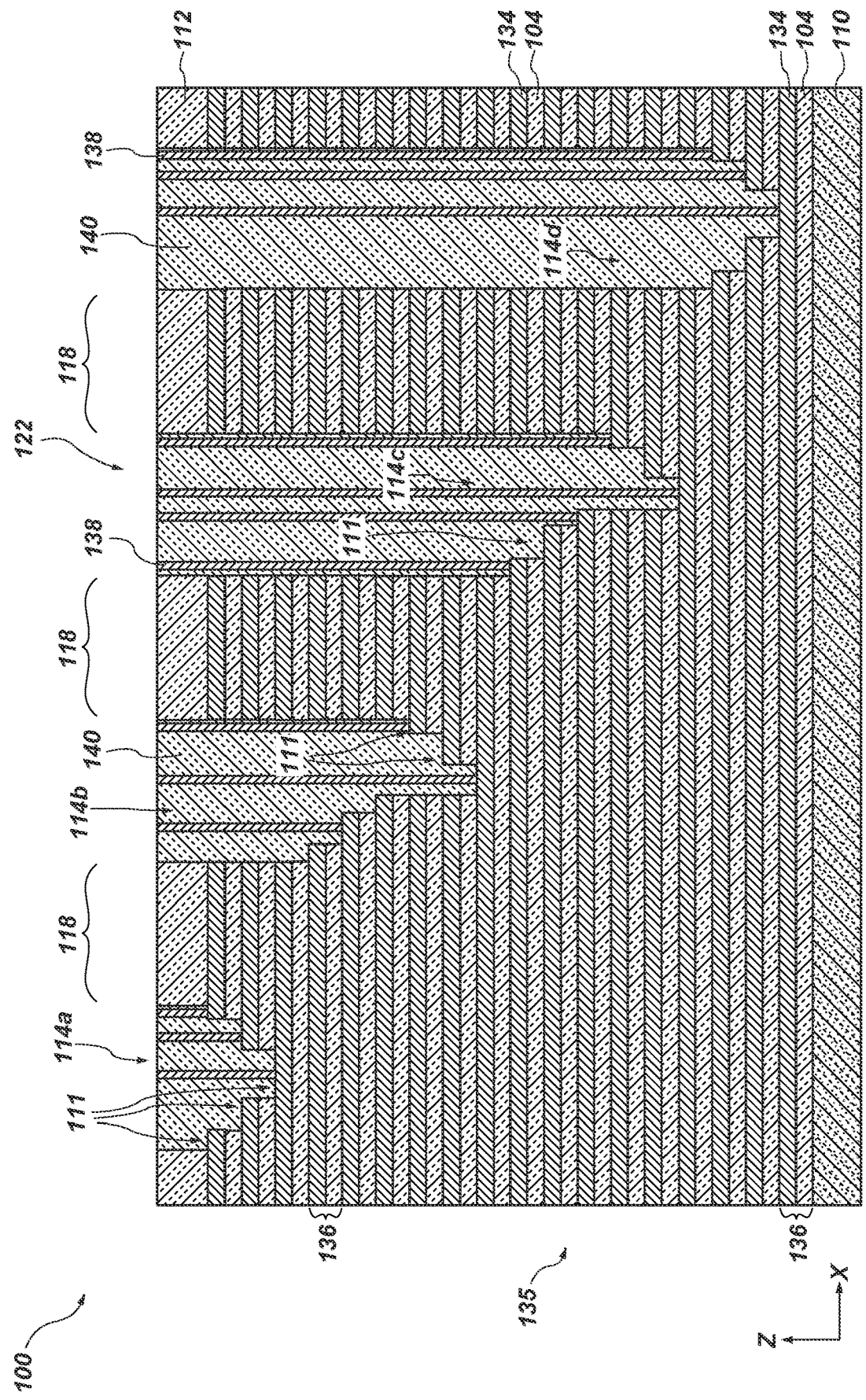
Figure 1M:
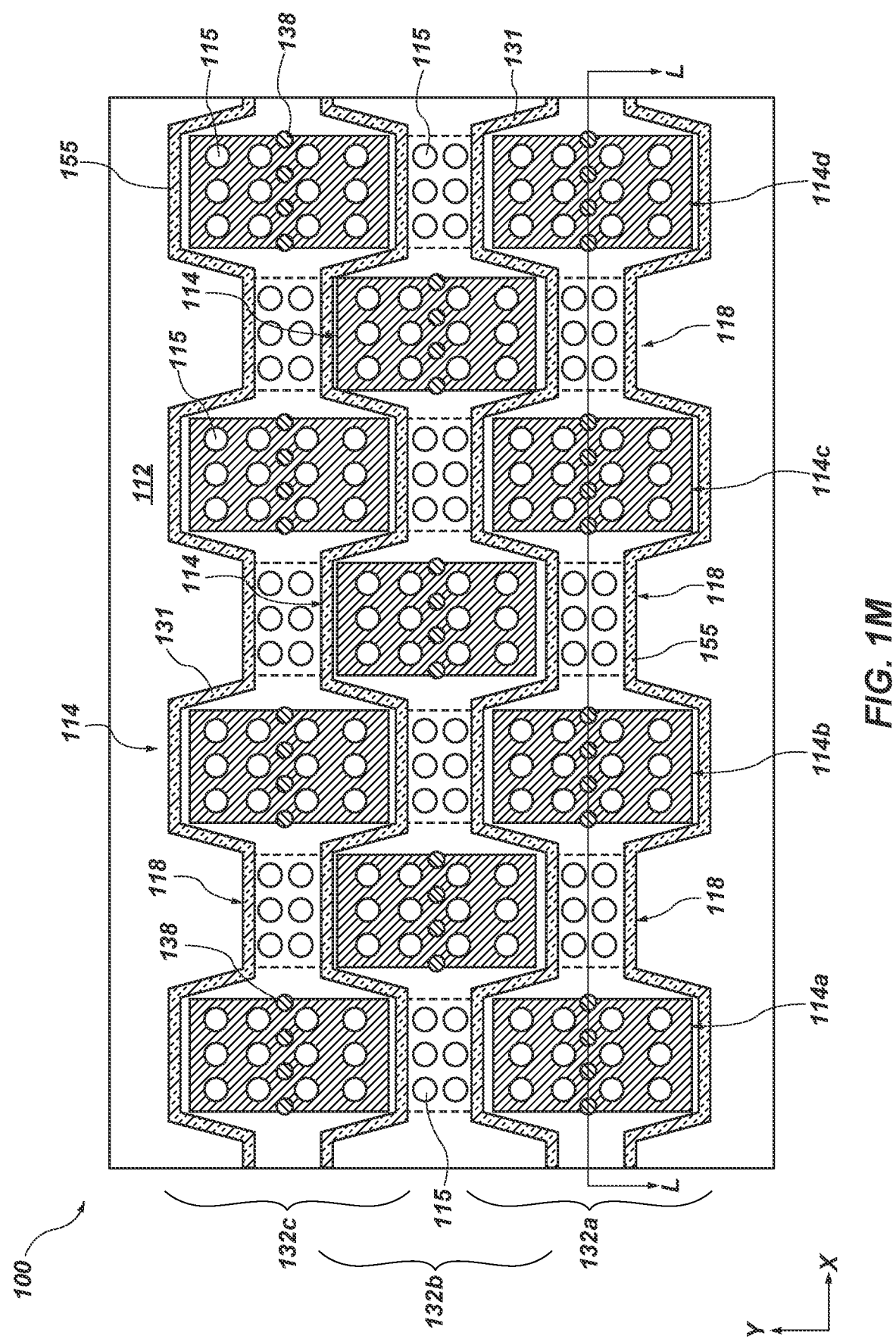

With reference now to FIG. 1L and FIG. 1M, conductive contact structures 138 may be formed in electrical communication with each of the steps 111 of the stair step structures 114. FIG. 1L is a simplified cross-sectional view of the microelectronic device structure 100 of FIG. 1M taken through section line L-L of FIG. 1M.

With reference to FIG. 1L, a dielectric material 140 may be formed over the microelectronic device structure 100 and within the stair step structures 114. Dielectric material 140 outside of the stair step structures 114 may be removed by exposing the microelectronic device structure 100 to a planarization process, such as a chemical mechanical planarization (CMP) process.

The dielectric material 140 may include insulative material. In some embodiments, the dielectric material 140 includes one or more of the materials described above with reference to the insulative structures 104. In some embodiments, the dielectric material 140 comprises substantially the same material composition as the dielectric material 140. In some embodiments, the dielectric material 140 comprises silicon dioxide.

The conductive contact structures 138 may be formed of and include conductive material. In some embodiments, the conductive contact structures 138 comprise one or more of the materials described above with reference to the conductive structures 134. In some embodiments, the conductive contact structures 138 comprise substantially the same material composition as the conductive structures 134. In some embodiments, the conductive contact structures 138 comprise tungsten.

With reference to FIG. 1M, in some embodiments, the conductive contact structures 138 may be located within horizontal boundaries of the stair step structures 114 and may not be located within horizontal boundaries of the crest regions 118. The conductive contact structures 138 of a block structure 132a may be horizontally aligned (e.g., in the Y-direction) with other conductive contact structures 138 in the same block structure 132c. In addition, the conductive contact structures 138 of a first block structure 132a may be horizontally aligned (e.g., in the X-direction) with a corresponding conductive contact structure 138 of a second block structure 132b spaced from the first block structure 132a by a third block structure 132c. For example, conductive contact structures 138 of the first block structure 132a may be horizontally aligned (e.g., in the X-direction) with corresponding conductive contact structures 138 of the third block structure 132c. In other words, the conductive contact structures 138 of every other block structure 132 may be horizontally aligned (e.g., in the X-direction) and horizontally offset from the conductive contact structures 138 of an intervening block structure 132.

In some embodiments, the conductive contact structures 138 of a block structure 132 may be horizontally offset (e.g., in the X-direction, in the Y-direction, in the X-direction and the Y-direction) from the support pillar structures 115 of the same block structure 132. For example, the conductive contact structures 138 may be horizontally offset (e.g., in the X-direction and the Y-direction) from the support pillar structures 115 within horizontal boundaries of the same stair step structure 114 and from support pillar structures 115 within horizontal boundaries of the crest regions 118 of the same block structure 132. In other embodiments, the conductive contact structures 138 of a block structure 132 may be horizontally aligned (e.g., in the Y-direction) with the support pillar structures 115 of the same block structure 132.

In some embodiments, the staggered layout of the block structures 132 and the increased width (e.g., in the Y-direction) of the stair step structures 114 may facilitate an increased margin between the conductive contact structures 138 and the support pillar structures 115 located within the same stair step structures 114. For example, the staggered layout of the block structures 132 may facilitate placement of four (4) of the support pillar structures 115 across a dimension (e.g., in the Y-direction) of each stair step structure 114 while increasing a distance (e.g., margin) between the support pillar structures 115 and the conductive contact structures 138 by as much as about 50 percent compared to conventional microelectronic device structures.

With continued reference to FIG. 1M, after performing the replacement gate process (e.g., after forming the slots 130, removing the additional insulative structures 106 through the slots 130, and forming the conductive structures 134 through the slots 130), the slots 130 may be filled with an insulative material to form slot structures 155. By way of non-limiting example, the slots 130 may be filled with a dielectric material including one or more of the materials described above with reference to the insulative structure 104 to form the slot structures 155. In other embodiments, a liner comprising an insulative material may be formed within the slots 130, and remaining portions of the slots 130 may be filled with another material (e.g., a conductive material) to form the slot structures 155.

Figure 1N:
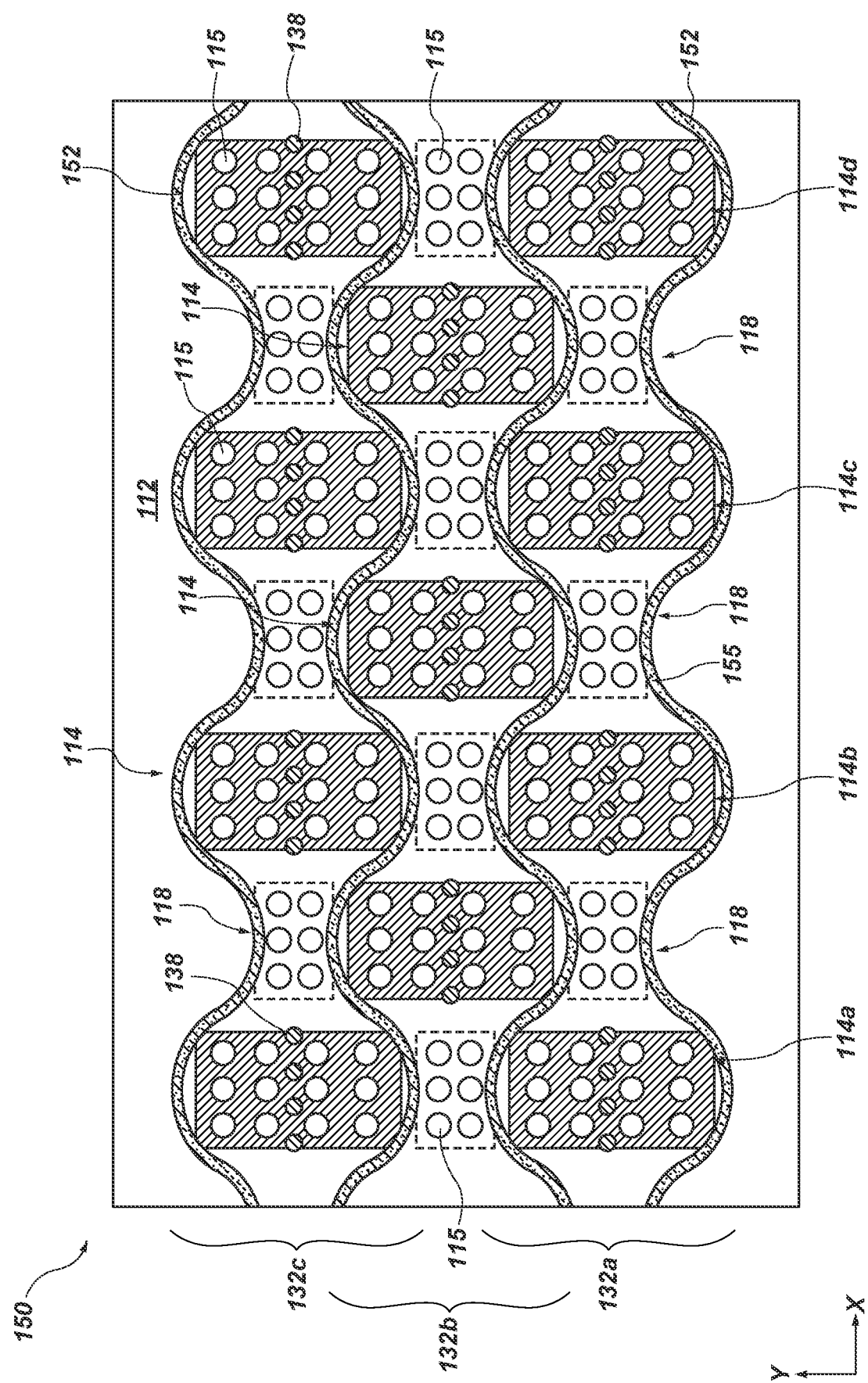
FIG. 1N is a simplified top-down view of a microelectronic device structure, in accordance with embodiments of the disclosure.

Although FIG. 1A through FIG. 1M have been described and illustrated as having slots 130 and slot structures 155 exhibiting a particular shape and configuration, the disclosure is not so limited. FIG. 1N, is a simplified top-down view of a microelectronic device structure 150, in accordance with embodiments of the disclosure. The microelectronic device structure 150 may be substantially similar to the microelectronic device structure 100 described above with reference to FIG. 1M, except that the microelectronic device structure 150 may include slot structures 152 exhibiting a different shape than the slot structures 130 (FIG. 1M). For example, the slot structures 152 may exhibit an arcuate (e.g., curved) shape. In some embodiments, the slot structures 152 exhibit a weave shape to define horizontal boundaries of the block structures 132.

In some embodiments, staggering the block structures 132 facilitates an increased horizontal dimension (e.g., in the Y-direction) of mask materials (e.g., chop mask materials, such as the first chop mask material, the second chop mask material, the third chop mask material) during formation of the stair step structures 114. Stated another way, the layout of the block structures 132 may facilitate an increased critical dimension of the mask materials during fabrication of the stair step structures 114. In addition, the staggered block structures 132 may facilitate an increased area of the stair step structures 114 compared to conventional microelectronic device structures. The increased area of the stair step structures 114 facilitates an increased number of support pillar structures 115 within horizontal boundaries of the stair step structures 114 and a greater distance (e.g., a greater margin) between the support pillar structures 115 and the conductive contact structures 138. The greater distance may substantially reduce or prevent shorting between adjacent support pillar structures 115 and conductive contact structures 138.

Figure 2:
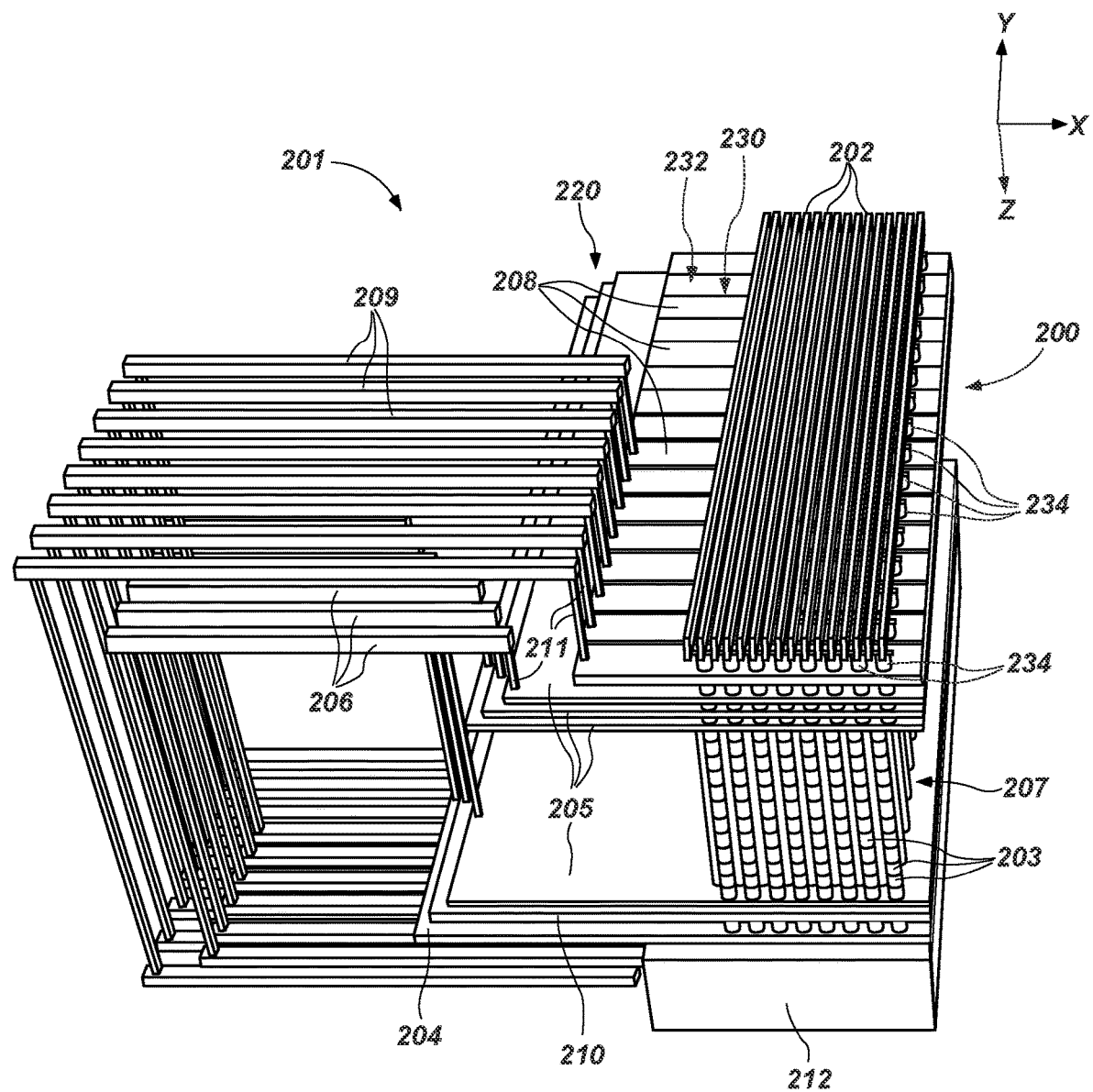
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structures 100, 150 following the processing stage previously described with reference to FIG. 1M and FIG. 1N. As shown in FIG. 2, the microelectronic device structure 200 may include a staircase structure 220 (e.g., including the stair step structures 114 (FIG. 1L)) defining contact regions for connecting access lines 206 to conductive tiers 205 (e.g., conductive layers, conductive plates, such as the conductive structures 134 (FIG. 1L)). The microelectronic device structure 200 may include vertical strings 207 of memory cells 203 that are coupled to each other in series. The vertical strings 207 may extend vertically (e.g., in the Z-direction) and orthogonally to conductive lines and tiers 205, such as data lines 202, a source tier 204 (e.g., the source structure 110 (FIG. 1L)), the conductive tiers 205, the access lines 206, first select gates 208 (e.g., upper select gates, drain select gates (SGDs)), select lines 209, and a second select gate 210 (e.g., a lower select gate, a source select gate (SGS)). The select gates 208 may be horizontally divided (e.g., in the Y-direction) into multiple blocks 232 (e.g., block structures 132 (FIG. 1M, FIG. 1N)) horizontally separated (e.g., in the Y-direction) from one another by slot structures 230 (e.g., filled slots, such as the slot structures 155 (FIG. 1M) and/or the slot structures 152 (FIG. 1N) comprising the slots 130 (FIG. 1I, FIG. 1J) filled with one or more insulative materials). As described above, with reference to the microelectronic device structure 100, the size, shape, and orientation of the slot structures 230 may facilitate an increased dimension of the stair step structures 114.

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the strings 207 of memory cells 203.

The conductive tiers 205 (e.g., word line plates, such as the conductive structures 134 (FIG. 1L)), may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the tiers 205 through the vertical conductive contacts 211. In other words, a particular level of the tiers 205 may be selected via an access line 206 in electrical communication with a respective conductive contact 211 in electrical communication with the particular tier 205.

The data lines 202 may be electrically coupled to the vertical strings 207 through conductive contact structure 234 (e.g., the conductive contacts (FIG. 1L)).

Thus, in accordance with embodiments of the disclosure a microelectronic device comprises a stack structure comprising a vertically alternating sequence of conductive structures and insulative structures arranged in tiers. The stack structure comprises a first block structure comprising stair step structures spaced from each other by crest regions, the stair step structures each comprising steps defined at horizontal edges of the tiers of the conductive structures and the insulative structures, and a second block structure horizontally neighboring the first block structure and comprising additional stair step structures spaced from one another by additional crest regions, the additional stair step structures horizontally offset from the stair step structures of the first block structure, and a slot structure extending though the stack structure and interposed between the first block structure and the second block structure.

Thus, in accordance with additional embodiments of the disclosure, a microelectronic device comprises a slot structure extending through a stack structure comprising tiers of alternating conductive structures and insulative structures, the slot structure comprising an insulative material, a first block structure of the stack structure on a first side of the slot structure, the first block structure comprising first stair step structures and first crest regions, and a second block structure of the stack structure on a second, opposite side of the slot structure, the second block structure comprising second stair step structures horizontally offset from the first stair step structures of the first block structure.

Thus in accordance with further embodiments of the disclosure, a method of forming a microelectronic device comprises forming a stack structure comprising tiers of alternating levels of insulative structures and additional insulative structures, forming stair step structures within the stack structure, the stair step structures spaced from each other by crest regions, forming support pillar structures comprising an insulative material extending through the stack structure, and forming a slot exhibiting a non-linear shape through the stack structure, the slot separating the stack structure into at least a first block structure comprising a first group of the stair step structures and a first group of the crest regions and a second block structure comprising a second group of the stair step structures and a second group of the crest regions, the stair step structure of the first group of stair step structures horizontally offset from the stair step structures of the second group of stair step structures.

Figure 3:
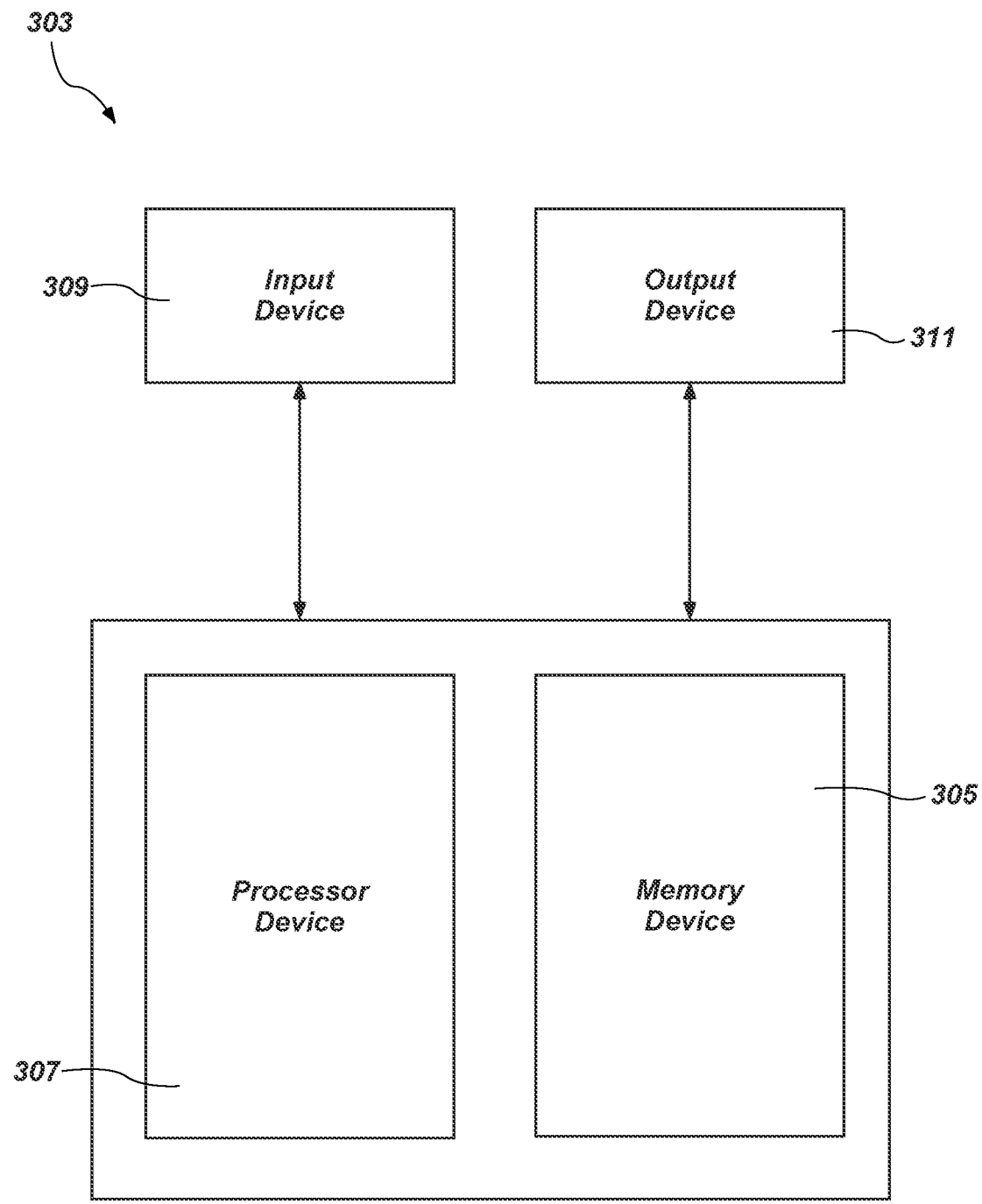
FIG. 3 is a block diagram of an electronic system, in accordance with embodiments of the disclosure.

Microelectronic devices (e.g., the microelectronic device 201) and microelectronic device structures (e.g., the microelectronic device structures 100, 200) of the disclosure may be included in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of one or more of the microelectronic device structures herein (e.g., the microelectronic device structure 100, 200) and a microelectronic device (e.g., the microelectronic device 201) previously described herein.

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
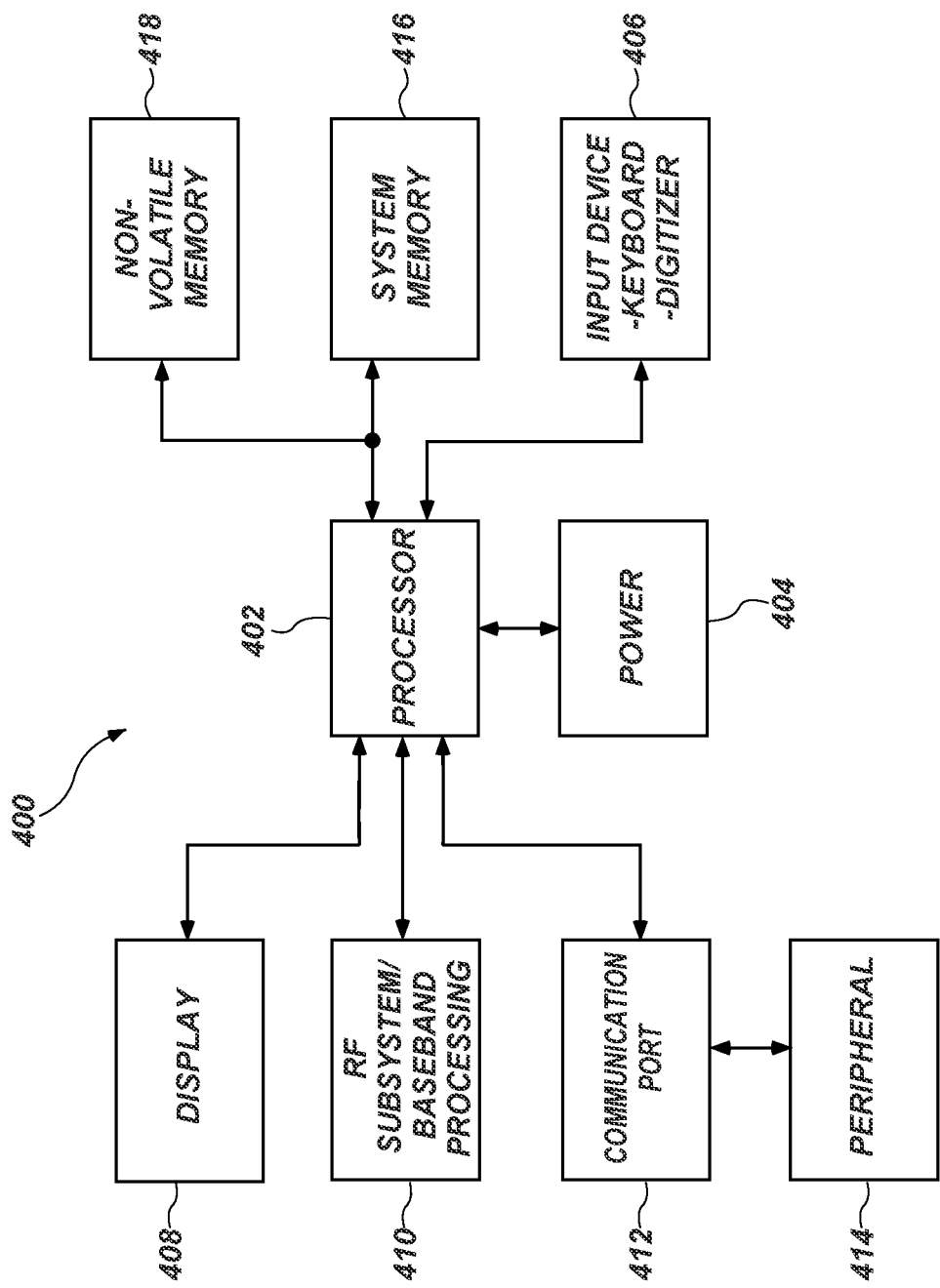
FIG. 4 is a block diagram of a processor-based system, in accordance with embodiments of the disclosure.

With reference to FIG. 4, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Further-more, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic device and a microelectronic device structure (previously described herein).

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises a stack structure comprising block structures exhibiting a staggered layout, a first block structure of the block structures inducing stair step structures horizontally offset in a first horizontal direction from stair step structures of a second block structure of the block structures, the second block structure horizontally neighboring the first block structures in a second horizontal direction, and slot structures exhibiting a non-linear shape and extending through the stack structure and dividing the stack structure into the block structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    a stack structure comprising a vertically alternating sequence of conductive structures and insulative structures arranged in tiers, the stack structure comprising:
    a first block structure comprising stair step structures spaced from each other by crest regions, the stair step structures each comprising steps defined at horizontal edges of the tiers of the conductive structures and the insulative structures;
    a second block structure horizontally neighboring the first block structure and comprising additional stair step structures spaced from one another by additional crest regions, the additional stair step structures horizontally offset from the stair step structures of the first block structure;
    a slot structure extending though the stack structure and interposed between the first block structure and the second block structure; and
    support pillar structure extending through the stack structure, support pillar structures within horizontal boundaries of the stair step structures horizontally offset from support pillar structures within the crest regions.

2. The microelectronic device of claim 1, wherein the slot structure comprises a non-linear shape.

3. The microelectronic device of claim 1, wherein the crest regions of the first block structure are horizontally aligned with the additional stair step structures of the second block structure.

4. The microelectronic device of claim 1, wherein the second block structure exhibits substantially the same configuration as the first block structure and is horizontally offset from the first block structure.

5. The microelectronic device of claim 1, wherein the stack structure further comprises a third block structure substantially the same as the first block structure and spaced from the first block structure by the second block structure.

6. The microelectronic device of claim 5, wherein stair step structures of the third block structure are horizontally aligned with stair step structures of the first block structure having a same vertical height.

7. The microelectronic device of claim 1, wherein the stair step structures include a greater number of the support pillar structures within horizontal boundaries thereof than the crest regions.

8. The microelectronic device of claim 1,
    further comprising conductive contact structures in electrical communication with the conductive structures, the conductive structures horizontally offset from the support pillar structures.

9. The microelectronic device of claim 1, further comprising strings of memory cells extending through the stack structure.

10. A microelectronic device, comprising:
a slot structure extending through a stack structure comprising tiers of alternating conductive structures and insulative structures, the slot structure comprising an insulative material;
a first block structure of the stack structure on a first side of the slot structure, the first block structure comprising first stair step structures and crest regions;
a second block structure of the stack structure on a second, opposite side of the slot structure, the second block structure comprising second stair step structures horizontally offset from the first stair step structures of the first block structure; and
support pillar structures within horizontal boundaries of the first stair step structures and the crest regions, a spacing between the support pillar structures within the first stair step structures greater than a spacing between the support pillar structures within the crest regions.

11. The microelectronic device of claim 10, wherein the slot structure comprises angled portions.

12. The microelectronic device of claim 10, wherein the slot structure comprises an arcuate shape.

13. The microelectronic device of claim 10, further comprising additional support pillar structures within the second block structure.

14. The microelectronic device of claim 13, wherein the support pillar structures within the horizontal boundaries of the first stair step structures are horizontally aligned with the additional support pillar structures within the second block structure.

15. The microelectronic device of claim 10, further comprising conductive contact structures extending through the stack structure and in electrical communication with the conductive structures, the conductive contact structures within the first block structure horizontally offset from the conductive contact structures within the second block structure.

16. The microelectronic device of claim 10, further comprising additional crest regions within the second block structure, the additional crest regions horizontally offset from the crest regions of the first block structure.

17. The microelectronic device of claim 10,
further comprising conductive contact structures extending through the stack structure and in electrical communication with the conductive structures, the conductive contact structures horizontally offset from the support pillar structures.

18. A method of forming a microelectronic device, the method comprising:
forming a stack structure comprising tiers of alternating levels of insulative structures and additional insulative structures;
forming stair step structures within the stack structure, the stair step structures spaced from each other by crest regions;
forming support pillar structures comprising an insulative material extending through the stack structure and within horizontal boundaries of stair step structures and horizontal boundaries of the crest regions; and
forming a slot exhibiting a non-linear shape through the stack structure, the slot separating the stack structure into at least a first block structure comprising a first group of the stair step structures and a first group of the crest regions and a second block structure comprising a second group of the stair step structures and a second group of the crest regions, the stair step structure of the first group of stair step structures horizontally offset from the stair step structures of the second group of stair step structures, a spacing between support pillar structures within the first group of the stair step structures greater than a spacing between support pillar structures within the first group of the crest regions.

19. The method of claim 18, wherein forming stair step structure comprises:
forming a chop mask material over portions of the stack structure; and
removing portions of the tiers of alternating levels of insulative structures and other insulative structures.

20. The method of claim 18, further comprising forming the support pillar structures through the stack structure prior to forming the slot structure.

21. The method of claim 20, wherein forming the support pillar structures comprises forming the support pillar structures within the first group of stair step structures to be horizontally offset from the support pillar structures within the first group of crest regions.

22. The method of claim 18, further comprising:
removing the additional insulative structures through the slot; and
forming conductive structures between vertically neighboring insulative structures.

23. The method of claim 22, further comprising forming electrically conductive contact structures in electrical communication with the conductive structures.

24. The method of claim 23, wherein forming the electrically conductive contact structures comprises forming the electrically conductive contact structures to be horizontally offset from the support pillar structures.

25. An electronic system, comprising:
an input device;
an output device;
a processor device operably coupled to the input device and the output device; and
a memory device operably coupled to the processor device and comprising at least one microelectronic device structure, the at least one microelectronic device structure comprising:
a stack structure comprising block structures exhibiting a staggered layout, the block structures comprising:
a first block structure;
a second block structure directly horizontally neighboring the first block structure in a first horizontal direction; and
a third block structure directly horizontally neighboring the second block structure in the first horizontal direction, the second block structure directly between the first block structure and the third block structure without intervening block structures, the second block structure including stair step structures horizontally offset in a second horizontal direction from stair step structures of the first block structure and stair step structures of the third block structure; and
slot structures exhibiting a non-linear shape and extending through the stack structure and dividing the stack structure into the block structures.

26. The electronic system of claim 25, wherein the stair step structures of the third block structure are horizontally aligned in the second horizontal direction with the stair step structures of the first block structure.

* * * * *

UNITED STATES PATENT AND TRADEMARK OFFICE
CERTIFICATE OF CORRECTION

PATENT NO. : 11,700,727 B2
APPLICATION NO. : 17/111275
DATED : July 11, 2023
INVENTOR(S) : Shruthi Kumara Vadivel, Yi Hu and Harsh Narendrakumar Jain It is certified that error appears in the above-identified patent and that said Letters Patent is hereby corrected as shown below:

In the Specification
Column 12, Line 67, change "comprises Sift. In" to --comprises $SiO_2$. In--
Column 17, Line 67, change "structure 132a may" to --structure 132 may--
Column 18, Line 2, change "structure 132c. In" to --structure 132. In--

Signed and Sealed this
Thirty-first Day of October, 2023

Katherine Kelly Vidal
*Director of the United States Patent and Trademark Office*